(12) United States Patent
den Boer et al.

(10) Patent No.: US 8,147,975 B2
(45) Date of Patent: Apr. 3, 2012

(54) PLASMA DISPLAY PANEL INCLUDING FRAMELESS EMI FILTER, AND/OR METHOD OF MAKING THE SAME

(75) Inventors: Willem den Boer, Brighton, MI (US); Philip J. Lingle, Temperance, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 358 days.

(21) Appl. No.: 12/289,921

(22) Filed: Nov. 6, 2008

(65) Prior Publication Data

US 2010/0046191 A1 Feb. 25, 2010

Related U.S. Application Data

(63) Continuation-in-part of application No. 12/230,033, filed on Aug. 21, 2008, now Pat. No. 7,713,633, and a continuation-in-part of application No. 12/230,034, filed on Aug. 21, 2008.

(51) Int. Cl.
*B32B 17/06* (2006.01)

(52) U.S. Cl. ........ 428/432; 428/433; 428/446; 428/697; 428/698; 428/701; 428/702; 428/704; 428/699

(58) Field of Classification Search .................. 428/426, 428/432, 433, 446, 697, 698, 701, 702, 704, 428/699
See application file for complete search history.

(56) References Cited

U.S. PATENT DOCUMENTS

| | | | |
|---|---|---|---|
| 5,650,597 A | 7/1997 | Redmayne | |
| 6,104,530 A | 8/2000 | Okamura et al. | |
| 6,177,918 B1 | 1/2001 | Colgan et al. | |
| 6,204,897 B1 | 3/2001 | Colgan et al. | |
| 6,391,462 B1 | 5/2002 | Jang | |
| 6,576,349 B2 | 6/2003 | Lingle et al. | |
| 6,891,322 B2 | 5/2005 | Lee et al. | |
| 7,215,331 B2 | 5/2007 | Song et al. | |
| 7,255,980 B2 | 8/2007 | Hwang et al. | |
| 7,344,782 B2 | 3/2008 | Lingle et al. | |
| 7,372,510 B2 | 5/2008 | Abileah | |
| 7,436,393 B2 | 10/2008 | Hong et al. | |
| 7,713,633 B2 | 5/2010 | Lingle et al. | |
| 7,931,971 B2 | 4/2011 | Lingle et al. | |
| 2003/0150711 A1 | 8/2003 | Laird | |

(Continued)

FOREIGN PATENT DOCUMENTS

EP 1 043 606 10/2000

(Continued)

OTHER PUBLICATIONS

Partial International Search Report dated Sep. 30, 2009.

(Continued)

*Primary Examiner* — Gwendolyn Blackwell
(74) *Attorney, Agent, or Firm* — Nixon & Vanderhye P.C.

(57) ABSTRACT

A plasma display panel (PDP) includes a frameless EMI filter supported by a glass substrate for blocking/shielding substantial amounts of electromagnetic waves, with the filter being supported by a side of the substrate opposite a viewer. In certain example embodiments, the PDP filter includes a transparent conductive coating (TCC) for electromagnetic interference (EMI) and near infrared (NIR) blocking without the need for a conductive, peripheral buss bar. Additionally, in certain example embodiments, the need for a conductive frame is reduced or eliminated. The filter has high visible transmission, and is capable of blocking/shielding electromagnetic waves.

21 Claims, 16 Drawing Sheets

U.S. PATENT DOCUMENTS

| | | |
|---|---|---|
| 2004/0043226 A1 | 3/2004 | Laird et al. |
| 2004/0086723 A1* | 5/2004 | Thomsen et al. ............. 428/426 |
| 2006/0081581 A1 | 4/2006 | Odeh |
| 2006/0083938 A1 | 4/2006 | Kim et al. |
| 2007/0082219 A1* | 4/2007 | Fleury et al. .................. 428/656 |
| 2008/0012493 A1 | 1/2008 | Lee et al. |
| 2008/0248219 A1* | 10/2008 | Chang ........................... 428/1.1 |

FOREIGN PATENT DOCUMENTS

| | | |
|---|---|---|
| EP | 1 648 013 | 4/2006 |
| EP | 1 829 835 | 9/2007 |
| EP | 1 849 594 | 10/2007 |
| EP | 1 860 930 | 11/2007 |
| EP | 1 909 552 | 4/2008 |
| KR | 2003-0038833 | 5/2003 |
| WO | WO 2005/086645 | 9/2005 |

OTHER PUBLICATIONS

U.S. Appl. No. 12/230,033, filed Aug. 21, 2008; Lingle et al.
U.S. Appl. No. 12/926,479, filed Nov. 19, 2010; Lingle et al.
U.S. Appl. No. 12/230,034, filed Aug. 21, 2008; Wang et al.
U.S. Appl. No. 13/064,426, filed Mar. 24, 2011; Lingle et al.
U.S. Appl. No. 61/129,404, filed Jun. 24, 2008 (Wang).
U.S. Appl. No. 61/071,936, filed May 27, 2008 (Lingle et al.).
U.S. Appl. No. 12/659,912, filed Mar. 25, 2010; Lingle et al.
U.S. Appl. No. 12/289,921, filed Nov. 6, 2008; den Boer et al.

* cited by examiner

| | | | Thickness (nm) |
|---|---|---|---|
| 21 | SiNx o/c | 45 | 24.4 |
| 20 | SnO2 | 43 | 15.0 |
| 19 | NiCrOx-high | 41 | 1.0 |
| 18 | Ag | 39 | 16.8 |
| 17 | ZnO | 37 | 10.0 |
| 16 | SnO2 | 33 | 68.4 |
| 15 | NiCrOx-high | 31 | 1.0 |
| 14 | Ag | 29 | 18.2 |
| 13 | ZnO | 27 | 10.0 |
| 12 | TiO2 | 24 | 15.0 |
| 11b | SiNx Base | 26 | 12.0 |
| 11a | SiNx o/c | 25 | 20.2 |
| 10 | SnO2 | 23 | 12.0 |
| 9 | NiCrOx-high | 21 | 1.0 |
| 8 | Ag | 19 | 15.2 |
| 7 | ZnO | 17 | 10.0 |
| 6 | SnO2 | 13 | 68.4 |
| 5 | NiCrOx-high | 11 | 1.0 |
| 4 | Ag | 9 | 12.6 |
| 3 | ZnO | 7 | 10.0 |
| 2 | TiO2 | 4 | 15.0 |
| 1 | SiNx Base | 3 | 12.0 |
| | Glass | 1 | |

| | |
|---|---|
| total Ag | 62.7 |
| Total Dielectric | 302.5 |
| sheet resistance | 0.85 |

Fig. 1(a)

| AR on 1st surface, TCC on 2nd surface dye either between AR and TCC, or atop TCC | CIE-C and 2 deg viewing | | | | 595nm | | 850nm | | 950nm | | 1800nm | |
|---|---|---|---|---|---|---|---|---|---|---|---|---|
| | T% | x' | y' | R% | Haze % | T% | R% | T% | R% | T% | R% | T% | R% |
| | 42.4 | 0.282 | 0.294 | 1.6 | <1 | 18.4 | 0.4 | 3.7 | 50.5 | 0.7 | 64.3 | 0.0 | 85.7 |

AS COCOATED POST HT

| | | 0.90 ohm design | Thickness (nm) |
|---|---|---|---|
| Pass 2 | 25 | SiNx-HT | 24.3 |
| | 24 | SnO2-HT | 12.0 |
| | 23 | NiCrOx-HT | 2.0 |
| | 22 | Ag | 15.7 |
| | 21 | ZnO | 9.0 |
| | 20 | SnO2-HT (Glue) | 9.0 |
| | 19 | SiNx-HT | 12.0 |
| | 18 | SnO2-HT | 45.5 |
| | 17 | NiCrOx-HT | 2.0 |
| | 16 | Ag | 14.7 |
| | 15 | ZnO | 9.0 |
| | 14 | SiNx Base HT | 11.0 |
| | 13b | TiO2 | 9.5 |
| Pass 1 | 13a | SiNx-HT | 21.5 |
| | 12 | SnO2-HT | 12.0 |
| | 11 | NiCrOx-HT | 2.0 |
| | 10 | Ag | 13.2 |
| | 9 | ZnO | 3.0 |
| | 8 | SnO2-HT (Glue) | 9.0 |
| | 7 | SiNx-HT | 12.0 |
| | 6 | SnO2-HT | 41.2 |
| | 5 | NiCrOx-HT | 2.0 |
| | 4 | Ag | 10.8 |
| | 3 | ZnO | 9.0 |
| | 2 | SiNx Base HT | 12.2 |
| | 1 | TiO2 | 9.5 |
| Glass | | | |
| | | | 339.1 |
| | | Total Ag | 54.4 |
| | | Total Dielectric | 276.7 |

Fig. 20

| 24 | ZnO: Al or SnO: Sb or ITO or TiOx:Nb | 2110 |
|---|---|---|
| 23 | NiCrOx - HT | 41 |
| 22 | Ag | 39 |
| 21 | ZnO | 37 |
| 20 | SnO2 - HT (Glue) | 2108c |
| 19 | SiNx - HT | 2108b |
| 18 | SnO2 - HT | 2108a |
| 17 | NiCrOx - HT | 31 |
| 16 | Ag | 29 |
| 15 | ZnO | 27 |
| 14 | SiNx Base HT | 26 |
| 13b | TiO2 | 24 |
| 13a | SiNx - HT | 2106b |
| 12 | SnO2 - HT | 2106a |
| 11 | NiCrOx - HT | 21 |
| 10 | Ag | 19 |
| 9 | ZnO | 17 |
| 8 | SnO2 - HT (Glue) | 2104c |
| 7 | SiNx - HT | 2104b |
| 6 | SnO2 - HT | 2104a |
| 5 | NiCrOx - HT | 11 |
| 4 | Ag | 9 |
| 3 | ZnO | 7 |
| 2 | SiNx Base HT | 2102 |
| 1 | TiO2 | 4 |
| | Glass | 1 |

2200 (brace encompassing layers 1–24)

Fig. 22

PLASMA DISPLAY PANEL INCLUDING FRAMELESS EMI FILTER, AND/OR METHOD OF MAKING THE SAME

CROSS-REFERENCE TO RELATED APPLICATIONS

This application is a continuation-in-part of each of application Ser. No. 12/230,033 filed Aug. 21, 2008 now U.S. Pat. No. 7,713,633 and Ser. No. 12/230,034, filed Aug. 21, 2008, the entire contents of each of which are hereby incorporated herein by reference.

FIELD OF THE INVENTION

Certain example embodiments of this invention relate to a plasma display panel (PDP) including a filter supported by a glass substrate for blocking/shielding substantial amounts of electromagnetic waves, with the filter being supported by a side of the substrate opposite a viewer. More particularly, certain example embodiments relate to a PDP filter that includes a transparent conductive coating (TCC) for electromagnetic interference (EMI) and near infrared (NIR) blocking without the need for a conductive, peripheral buss bar. Additionally, in certain example embodiments, the need for a conductive frame is reduced or eliminated. The filter has high visible transmission, and is capable of blocking/shielding electromagnetic waves. Certain example embodiments of this invention also provide methods of making the same.

BACKGROUND AND SUMMARY OF EXAMPLE EMBODIMENTS OF THE INVENTION

Image display devices are being widely used in a variety of applications, including TV screens, monitors of personal computers, etc. The plasma display panel (PDP) is gaining popularity as a next-generation display device to replace the CRT because a PDP is thin and a large screen can be readily fabricated with a plurality of units. A PDP includes a plasma display panel on which an image is displayed using a gas discharge phenomenon, and exhibits superior display capabilities, including high display capacity, high brightness, high contrast, clear latent image, a wide viewing angle, etc. In a PDP apparatus, when a direct current (DC) or alternating current (AC) voltage is applied to electrodes, a discharge of gas plasma is created, resulting in the emission of ultraviolet (UV) light. The UV emission excites adjacent phosphor materials, resulting in electromagnetic emission of visible light. Despite the above advantages, PDPs face several challenges associated with driving characteristics, including an increase in electromagnetic wave radiation, near-infrared emission, and phosphor surface reflection, and an obscured color purity due to orange light emitted from helium (He), neon, or xenon (Xe) used as a sealing gas.

Some believe that the electromagnetic waves and near-infrared rays generated in PDPs may adversely affect human bodies and cause malfunctions of precision machines such as wireless telephones or remote controllers (e.g., see U.S. 2006/0083938, incorporated herein by reference). These waves, taken individually or collectively, may be referred to as electromagnetic interference (EMI). Thus, in order to make use of such PDPs, there is a desire to reduce the electromagnetic waves and near-infrared (IR or NIR) rays emitted from the PDPs to a predetermined level or less. In this respect, various PDP filters have been proposed for shielding electromagnetic waves or near-infrared rays emitted from the PDPs, reducing reflection of light and/or enhancing color purity. The proposed PDP filters are also required to meet transmittance requirements because the filters are installed on a front surface of each of the PDPs.

In order to reduce the electromagnetic waves and NIR waves emitted from plasma display panels to a predetermined level or less, various PDP filters have been used for the purposes of, for example, shielding electromagnetic waves or NIR emitted from the PDPs, reducing reflection of light and/or enhancing color purity. High transmittance is required for such filters because they are generally applied to the front surface of PDPs. Typical electromagnetic wave shielding filters meeting such requirements and characteristics are classified into a metal mesh-pattern filter and a transparent conductive film filter. Although the metal mesh-pattern filter exhibits a good electromagnetic wave shielding effect, it has several disadvantages including poor transmittance, image distortion, and an increase in the production cost due to a costly mesh. Due to such disadvantages, electromagnetic wave shielding filters using transparent conductive films are being widely used instead of the metal mesh-pattern filter. The transparent conductive film is generally formed of a multi-level thin film structure in which a metal film and a high-refractive-index transparent thin layer are sandwiched. Silver or a silver-based alloy may be used as the metal film. However, conventional PDP EMI filters tend to lack durability and/or can stand to be improved upon with respect to visible transmission and/or shielding properties.

Moreover, certain PDP EMI filters need to be heat treated (e.g., thermally tempered). Such heat treatment typically requires the use of temperature(s) of at least 580 degrees C., more preferably of at least about 600 degrees C. and still more preferably of at least 620 degrees C. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., for a sufficient period to allow tempering and/or heat strengthening. In general, heat treating may be accomplished at temperatures of about 550 degrees C. to about 650 degrees C. In certain instances, the HT may be for at least about 4 or 5 minutes. The use of such high temperatures (e.g., for 5-10 minutes or more) often causes coatings to break down and/or causes one or more of the aforesaid desirable characteristics to significantly deteriorate in an undesirable manner. Conventional PDP EMI filters tend to suffer from a lack of thermal stability and/or durability upon heat treatment (HT). In particular, heat treatment tends to cause conventional PDP filters to break down.

In view of the above, there exists a need in the art for an improved PDP filter which is improved (with respect to conventional PDP EMI filters) with respect to one or more of: (i) improved chemical durability, (ii) improved thermal stability (e.g., upon optional heat treatment such as tempering), (iii) improved visible transmission, and/or (iv) improved EMI shielding properties.

To overcome these and/or other disadvantages, attempts have been made by the assignee of the instant invention to use a transparent conductive coating (TCC) as an EMI filter as described, for example, in Application Ser. No. 61/071,936, the entire contents of which are hereby incorporated herein by reference. FIGS. 14(a)-14(c) provide an example view of how a PDP filter may be arranged with reference to a front cover glass. More particularly, FIG. 14(a) is a cross sectional view of the EMI filter, front cover glass, and black and silver frit frames for use at the front of a PDP panel, FIG. 14(*b*) is a front or viewer's view of the EMI filter and black frit frame for use at the front of a PDP panel, and FIG. 14(*c*) is a rear or plasma view of the EMI filter and black and silver frit frames for use at the front of a PDP panel. As shown in these figures, a front cover glass 142 is provided. Black frit 144 and silver frit 146 are applied to the front cover glass 142 on the major surface thereof opposite the viewer, and they form the frames shown in FIGS. 14(*b*) and 14(*c*). Thus, the black frit 144 is visible from the viewer's side of the of the PDP panel, whereas the silver frit 146 is substantially hidden from the viewer's side of the PDP panel, as shown in FIG. 14(*b*). By contrast, both the silver frit 146 and the black frit 144 are visible from the plasma side of the PDP panel, as shown in FIG. 14(*c*), because of how and where the silver frit 146 is applied in relation to the black frit 144. As will be appreciated from FIGS. 14(*b*) and 14(*c*), the black frit 144 and the silver frit 146 are both provided around the periphery of the glass substrate 142, although the black frit 144 extends around and/or helps to conceal the silver frit 146 when viewed from the viewer's side, as shown in FIG. 14(*b*). In other words, the black frit 144 and the silver frit 146 frame the portion of the coated glass substrate 140, with the black frit 144 being the "inner mat" and the silver frit 146 being the "outer mat" when viewed from the plasma's side shown in FIG. 14(*c*). By comparison, the "single mat" visible from the viewer's side is the black frit 144. It will be appreciated that in some instances at least some black frit material may be visible "outside" the silver frit 146, but its presence generally is not a problem since the bezel or frame of the plasma display device typically conceals such areas, anyway.

In practice, the assembly shown in the FIG. 14 embodiment is made as follows. A front cover glass 142 is provided. It is coated with black frit 144 and silver frit 146 and cut to a predetermined size appropriate for the PDP in which it will be housed (e.g., such that the visible area 140 has a 42", 48", 50", 55", or larger or smaller diagonal dimension). The front cover glass 142 may be cut and then coated with black frit 144 and silver frit 146. The assembly including the front cover glass 142, black frit 144, and silver frit 146 is then fired and/or tempered. The TCC 148 finally is applied to the cut, fired/tempered assembly, typically via sputter coating or the like. Ultimately, a visible area 140 that is coated with TCC 148 will be framed by the black frit 144 and silver frit 146. It is noted that in this technique, the TCC 148 is applied over the black frit 144 and silver frit 146 such that, when ultimately assembled into a plasma display device, it will be the closest layer to the plasma television portion of assembly.

In view of the description provided above, it will be appreciated that the TCC 148 is applied after any kind of heat treatment and after the silver and black frits are applied. Furthermore, because the glass substrate 142 is cut to the appropriate predetermined size, it must be coated at this size. In other words, the TCC 148 is applied after the glass substrate 142 is cut to an appropriate size.

Although this process has been successful in producing high-quality PDPs and thus high-quality plasma display devices, further improvements are still possible and desirable. For example, the process described above often leads to a significant amount of waste and/or presents challenges when the TCC is applied. The assembly lines that provide the TCC coatings (e.g., sputtering assembly lines) typically are configured to accommodate stock, non-cut sheets that fit substantially the entire "bed size" of a conveyor. Unfortunately, the above-described process requires coating cut glass sheets. These cut glass sheets do not occupy the full dimensions of a typical conveyor or bed size, which leads to at least some of the problems noted below and/or presents other challenges.

To increase the yield of the coating process, various cut glass sheets may be arranged on the conveyor in close relative proximity to one another in order to attempt to fill up the area on the conveyor. In other words, cut glass sheets may be placed on a conveyor so as to approximate a large, un-cut glass sheet that would otherwise occupy substantially the entire bed size of the conveyor. Unfortunately, this compromise approach often takes time and/or significant manual effort, related at least in part to the careful arrangement of the cut glass sheets. Even with the attempted maximization of space, sputtered material is often wasted. Additionally, because the sheets oftentimes are small compared to bulk non-cut sheets, some sizes cannot be coated at all, while others inadvertently fall through rollers provided on the assembly line or are otherwise damaged or destroyed during the coating process.

Thus, it will be appreciated that there is a need in the art for improved PDPs, and/or improved PDP manufacturing techniques.

In certain example embodiments of this invention, a plasma display panel (PDP) includes a filter supported by a glass substrate for blocking/shielding substantial amounts of electromagnetic waves, with the filter being supported by a side of the substrate opposite a viewer. A black frit and a silver frit comprise a filter frame and are supported by the filter such that the filter is closer to the glass substrate than either or both of the frits. The filter has high visible transmission, and is capable of blocking/shielding electromagnetic waves. In certain example embodiments, a silver based coating of the EMI filter reduces damage from EMI radiation through highly conductive Ag layers, blocks significant amounts of NIR and IR radiation from outdoor sunlight to reduce PDP panel temperature, and enhances contrast ratio through reduced reflection, while maintaining high visible transmission. In certain example embodiments, the filter is a TCC filter. Advantageously, a TCC may be coated on a stock, non-cut glass sheet.

In certain example embodiments, a plasma display device is provided. A plasma display panel is provided. An electromagnetic interference (EMI) filter is provided at a front portion of the plasma display panel. The EMI filter includes a multi-layer silver-inclusive transparent conductive coating (TCC) supported by an inner surface of a glass substrate. An inner black frit frame is disposed around a portion of the glass substrate that corresponds to a visible portion of the plasma display panel. An outer silver frit frame is disposed around the inner black frit frame at the periphery of the glass substrate. The TCC is provided closer to the glass substrate than the inner and outer frit frames.

In certain example embodiments, a method of making a plasma display device including a plasma display panel and an electromagnetic interference (EMI) filter provided at a front portion of the plasma display panel is provided. A glass substrate is provided. A multi-layer silver-inclusive transparent conductive coating (TCC) is sputter coated on an inner surface of the substrate. After the sputter-coating of the TCC, the substrate is cut to a predetermined. An inner black frit frame is applied around a portion of the glass substrate that corresponds to a visible portion of the plasma display panel. An outer silver frit frame is applied around the inner black frit frame such that the outer silver frit frame will be located at the periphery of the cut glass substrate. At least one high-temperature treatment is performed. The at least one high-temperature treatment heat treats the cut substrate and melts together the black and silver frit frames. The TCC is provided closer to the glass substrate than the inner and outer frit frames.

In certain example embodiments, a method of making an electromagnetic interference (EMI) filter for a plasma display device is provided. A glass substrate is provided. A multi-layer silver-inclusive transparent conductive coating (TCC) is sputter coated on an inner surface of the substrate. After the sputter-coating of the TCC, the substrate is cut to a predetermined. An inner black frit frame is applied around a portion of the glass substrate that corresponds to a visible portion of the plasma display panel. An outer silver frit frame is applied around the inner black frit frame such that the outer silver frit frame will be located at the periphery of the cut glass substrate. At least one high-temperature treatment is performed. The at least one high-temperature treatment heat treats the cut substrate and melts together the black and silver frit frames. The TCC is provided closer to the glass substrate than the inner and outer frit frames.

In certain example embodiments, an electromagnetic interference (EMI) filter for use with a plasma display panel of a plasma display device is provided. A multi-layer silver-inclusive transparent conductive coating (TCC) is supported by an inner surface of a glass substrate. An inner black frit frame is disposed around a portion of the glass substrate that corresponds to a visible portion of the plasma display panel. An outer silver frit frame is disposed around the inner black frit frame at the periphery of the glass substrate. The TCC is provided closer to the glass substrate than the inner and outer frit frames.

In certain example embodiments, a method of making a plasma display device including a plasma display panel and an electromagnetic interference (EMI) filter provided at a front portion of the plasma display panel is provided. A glass substrate is provided. The glass substrate includes a sputter deposited multi-layer silver-inclusive transparent conductive coating (TCC) on an inner surface thereof. The glass substrate has been cut to a predetermined size following the sputter depositing of the TCC. An inner black frit frame is applied around a portion of the glass substrate that corresponds to a visible portion of the plasma display panel. An outer silver frit frame is applied around the inner black frit frame such that the outer silver frit frame will be located at the periphery of the cut glass substrate. At least one high-temperature treatment is performed. The at least one high-temperature treatment heat treats the cut substrate and melts together the black and silver frit frames. The TCC is provided closer to the glass substrate than the inner and outer frit frames. The inner black frit frame is non-conductive and the outer silver frit frame is conductive.

In certain example embodiments, a plasma display device is provided. A plasma display panel is provided. An electromagnetic interference (EMI) filter is provided at a front portion of the plasma display panel. The EMI filter includes a multi-layer silver-inclusive transparent conductive coating (TCC) supported by an inner surface of a glass substrate. A conductive black frit frame is disposed around the periphery of the glass substrate. The TCC is provided closer to the glass substrate than the conductive black frit frame.

In certain example embodiments, a method of making a plasma display device including a plasma display panel and an electromagnetic interference (EMI) filter provided at a front portion of the plasma display panel is provided. A glass substrate is provided. The glass substrate includes a sputter deposited multi-layer silver-inclusive transparent conductive coating (TCC) on an inner surface thereof. The glass substrate has been cut to a predetermined size following the sputter depositing of the TCC. A conductive black frit frame is applied around the periphery of the cut glass substrate. At least one high-temperature treatment is performed. The at least one high-temperature treatment heat treats the cut substrate and firing the conductive black frit frame. The TCC is provided closer to the glass substrate than the conductive black frit frames.

As noted above, when using a TCC, a conductive peripheral frame layer (frit) may be screen printed either on the bare glass substrate prior to TCC coating or on the coated glass substrate. Indeed, as shown in and described in connection with FIG. 16 below, the conductive buss bar makes contact with the metal frame of the television (e.g., through conductive tape, etc.). In certain current techniques used successfully by the assignee of the instant invention, the conductive buss bar comprises either a silver frit or a layered combination of a conductive silver frit and a non-conductive black frit (e.g., to produce a more aesthetically pleasing product). Unfortunately, however, the screen printing of the conductive frit on the glass adds process steps, increases manufacturing costs, and reduces manufacturing yield, e.g., for the reason described above. Furthermore, although the use of a conductive black frit has been successfully implemented by the assignee of the instant invention, further improvements are still possible. Indeed, it will be appreciated that the desire to reduce the cost of components in a plasma television is ongoing, and that one particular target for cost reduction involves yet further reductions in costs related to EMI filters.

In certain example embodiments of this invention, there is provided a plasma display device comprising a plasma display panel (PDP); and an electromagnetic interference (EMI) filter provided at a front portion of the plasma display panel. The EMI filter includes an EMI coating supported by a glass substrate, with the EMI coating including the following layers moving away from the glass substrate: a first high index layer having a refractive index (n) of at least about 2.2; a first layer comprising silicon nitride; a first layer comprising zinc oxide; a first EMI shielding layer comprising silver contacting the first layer comprising zinc oxide; a first layer comprising an oxide of Ni and/or Cr contacting the first EMI shielding layer comprising silver; a first metal oxide layer; a second layer of silicon nitride; a second layer comprising zinc oxide; a second EMI shielding layer comprising silver contacting the second layer comprising zinc oxide; a second layer comprising an oxide of Ni and/or Cr contacting the second EMI shielding layer comprising silver; a second metal oxide layer; a third layer of silicon nitride; a third layer comprising zinc oxide; a third EMI shielding layer comprising silver contacting the third layer comprising zinc oxide; a third layer comprising an oxide of Ni and/or Cr contacting the third EMI shielding layer comprising silver; and an overcoat layer comprising a transparent conducting oxide (TCO). The EMI filter has a sheet resistance of less than about 1 ohm.

In certain example embodiments of this invention, there is provided a plasma display device comprising a plasma display panel (PDP) and an electromagnetic interference (EMI) filter provided in direct electric contact with a front portion of the plasma display panel. The EMI filter includes an EMI coating supported by a glass substrate, with the EMI coating including the following layers moving away from the glass substrate: an anti-reflective coating; a first dielectric layer; a first EMI shielding layer comprising silver; a second dielectric layer; a second EMI shielding layer comprising silver; a third dielectric layer; a third EMI shielding layer comprising silver; a fourth dielectric layer; a fourth EMI shielding layer comprising silver; and an overcoat layer comprising a transparent conducting oxide (TCO). The glass substrate and the EMI coating combined have a visible transmission of at least about 60%. The EMI filter has a sheet resistance of less than about 0.9 ohm. The TCO has a refractive index of about 1.95-2.05.

In certain example embodiments of this invention, there is provided an EMI filter for a plasma display device comprising an EMI coating supported by a glass substrate. The EMI coating includes the following layers moving away from the glass substrate: a first high refractive index layer; a first layer comprising silicon nitride; a first layer comprising zinc oxide; a first EMI shielding layer comprising silver contacting the first layer comprising zinc oxide; a first layer comprising an oxide of Ni and/or Cr contacting the first EMI shielding layer comprising silver; a first metal oxide layer; a second layer of silicon nitride; a second layer comprising zinc oxide; a second EMI shielding layer comprising silver contacting the second layer comprising zinc oxide; a second layer comprising an oxide of Ni and/or Cr contacting the second EMI shielding layer comprising silver; a second metal oxide layer; a third layer of silicon nitride; a third layer comprising zinc oxide; a third EMI shielding layer comprising silver contacting the third layer comprising zinc oxide; a third layer comprising an oxide of Ni and/or Cr contacting the third EMI shielding layer comprising silver; a third metal oxide layer; a fourth layer of silicon nitride; a fourth layer comprising zinc oxide; a fourth EMI shielding layer comprising silver contacting the fourth layer comprising zinc oxide; a fourth layer comprising an oxide of Ni and/or Cr contacting the fourth EMI shielding layer comprising silver; and an overcoat layer comprising a transparent conducting oxide (TCO). The EMI filter has a sheet resistance of less than about 1 ohm. The overcoat layer comprising the TCO is about 30-40 nm thick. The TCO has a refractive index of about 1.95-2.05, more preferably about 2.0.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1(a) is a cross sectional view of an EMI filter for a plasma display panel (e.g., PDP panel) according to an example embodiment of this invention.

FIG. 20 is a cross sectional view of an EMI filter for a plasma display panel (e.g., PDP panel) according to an example embodiment of this invention.

FIG. 22 is a cross sectional view of an EMI filter for a plasma display panel (e.g., PDP panel) that does not necessarily require a conductive bus bar or conductive frame according to an example embodiment of this invention.

DETAILED DESCRIPTION OF EXAMPLE EMBODIMENTS OF THE INVENTION

Figure 1B:
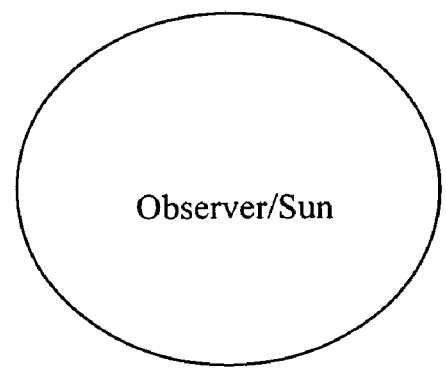
FIG. 1(b) is a cross sectional view of a PDP panel including an EMI filter (e.g., the filter of any embodiment herein) according to an example embodiment of this invention.

Referring now more particularly to the accompanying drawings in which like reference numerals indicate like parts/layers throughout the several views.

In certain example embodiments, a black frit and a silver frit comprise a filter frame and are supported by the filter such that the filter is closer to the glass substrate than either or both of the frits. Alternatively, in certain example embodiments, a conductive black frit comprises a filter frame and is supported by the filter such that the filter is closer to the glass substrate than the frit. Advantageously, a transparent conductive coating (TCC) may be coated on a stock, non-cut glass sheet, with the glass sheet later being cut to an appropriate size. In certain example embodiments, the TCC may be multi-layered and include 2 or more layers of silver.

For example, a TCC usable with certain example embodiments of this invention may be an Ag-based multiple layered TCC for display applications (e.g., PDP applications). This EMI filter coating includes three or more Ag based layers sandwiched between metal oxides, nitrides, or oxynitrides. It provides the functions of blocking EMI radiation and minimizing/reducing near infrared and infrared transmissions. The Ag based transparent conductive coating can be manufactured by magnetron sputtering on glass in certain example embodiments. The coating on glass may go through a post heat-treatment in a typical oven or tempering furnace to enhance glass strength and increase coating conductivity and transparency in certain example embodiments (e.g., heat treatment). In certain example embodiments, the Ag-based TCC (or EMI filter) coating includes or consists of four layers of ZnOx/Ag/NiCrOx sandwiched between metal oxides and nitrides. In certain example embodiments, the metal oxides (e.g., tin oxide, zinc oxide) and nitrides (e.g., silicon nitride) used have refractive indices (n) in visible higher than 1.8, and can be nonconductive such as SiNx or conductive such as ZnAlOx. In certain example embodiments, certain of the materials (e.g., Ag, zinc oxide based layers, and NiCrOx based layers) are the same for all three or four stacks, but the thickness of the dielectric and Ag layers are adjusted to meet the sheet resistance and optics targets for each of the layer stacks. Moreover, other layers may differ from stack to stack in order to enhance durability and optical performance. In certain example embodiments, the EMI filter may also include a conductive frit frame around the periphery to provide a low conductance contact to the housing of the plasma TV. The completed filter may also include AR coating film laminated to the front surface to reduce display reflectance and a laminate with a purple and/or pink dye attached to the back of the coated glass to improve color performance of the plasma TV. Further details of such an example EMI filter are provided below. It will be appreciated that other EMI filters may be used in connection with example embodiments of this invention.

Figure 15A:
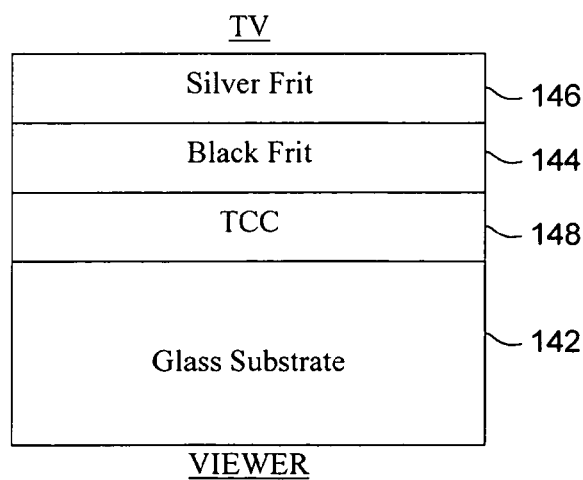
FIG. 15(a) is a cross sectional view of the EMI filter (TCC), front cover glass, and black and silver frit frames for use at the front of a PDP panel according to an example embodiment.
Figure 15B:
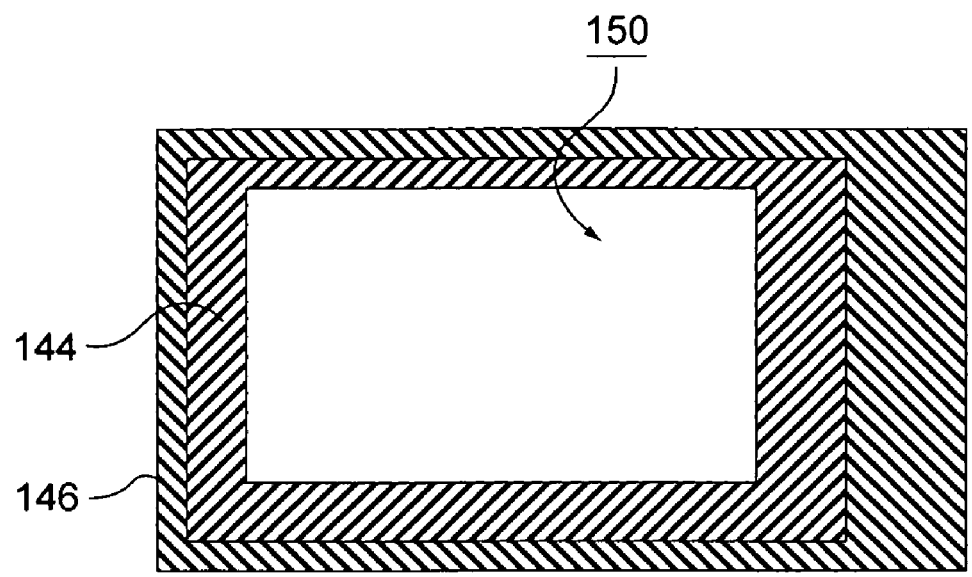
FIG. 15(b) is a front or viewer's view of the EMI filter (TCC) and black and silver frit frames for use at the front of a PDP panel according to an example embodiment.
Figure 15C:
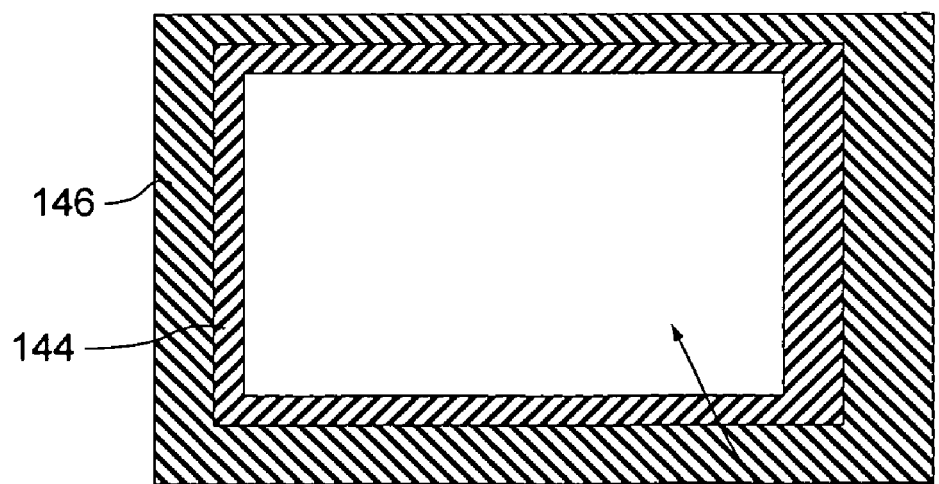
FIG. 15(c) is a rear or plasma view of the EMI filter (TCC) and black and silver frit frames for use at the front of a PDP panel according to an example embodiment.

FIGS. 15(a)-15(c) provide an example view of how a PDP filter may be arranged with reference to a front cover glass according to an example embodiment. More particularly, FIG. 15(a) is a cross sectional view of the EMI filter (TCC), front cover glass, and black and silver frit frames for use at the front of a PDP panel according to an example embodiment, FIG. 15(b) is a front or viewer's view of the EMI filter (TCC) and black and silver frit frames for use at the front of a PDP panel according to an example embodiment, and FIG. 15(c) is a rear or plasma view of the EMI filter (TCC) and black and silver frit frames for use at the front of a PDP panel according to an example embodiment.

Figure 14A:
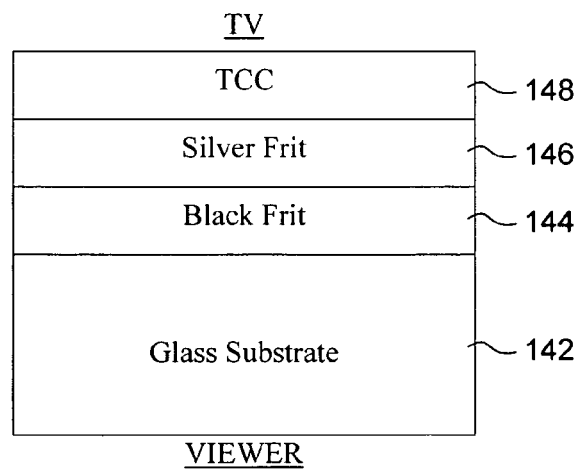
FIG. 14(a) is a cross sectional view of the EMI filter, front cover glass, and black and silver frit frames for use at the front of a PDP panel.
Figure 14B:
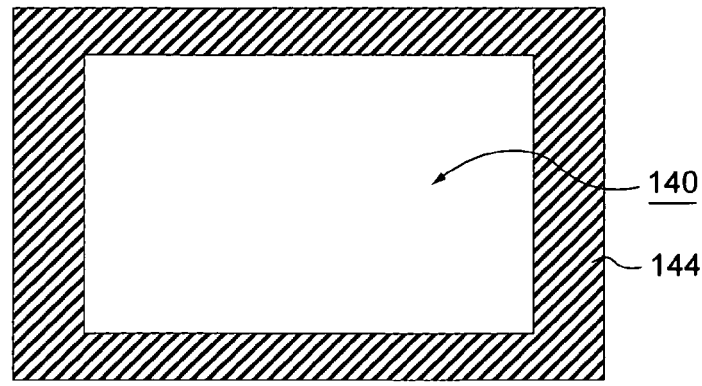
FIG. 14(b) is a front or viewer's view of the EMI filter and black frit frame for use at the front of a PDP panel.
Figure 14C:
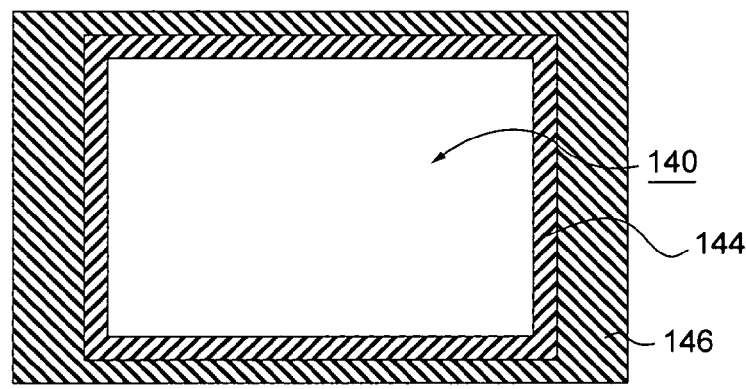
FIG. 14(c) is a rear or plasma view of the EMI filter and black and silver frit frames for use at the front of a PDP panel.

Similar to the arrangement shown in FIG. 14(a), the arrangement shown in FIG. 15(a) includes a TCC coating 148 located on a side of the front cover glass 142 opposite the viewer. However, unlike the FIG. 14(a) arrangement, the TCC 148 of the FIG. 15(a) arrangement is provided adjacent to the glass substrate 142. The black frit 144 and silver frit 146 are supported by the TCC 148, such that they are farther from the viewer than the TCC 148.

As shown in FIGS. 15(b) and 15(c), the black frit 144 and silver frit 146 form frames around the visible area 150. Also as shown, the black frit 144 may be applied around the visible area 150, although it need not extend all the way to the edge of the glass. By contrast, the silver frit 146 is provided outside or around the black frit at the periphery of the front cover glass 142. Thus, in certain example embodiments, the silver frit 146 may run up to the edge of the front cover glass 142 and may extend around its periphery. The silver frit 146 and the black frit 144 may overlap slightly, but the silver frit 146 should not extend into the viewing area 150. As such, the black frit 144 forms an inner frame, whereas the silver frit 146 forms an outer frame although, as noted above, the silver frit 146 and the black frit 144 may sometimes overlap slightly. Indeed, it is sometimes hard to apply frit material with precision and it is therefore sometimes hard to create exact boundaries. However, the silver frit 146 may be applied in a wide manner and can cover some of the black frit 144, provided that the silver frit is not present or at is at least not perceivable in the visible area 150.

The PDP of certain example embodiments may be made according to several different processes. A glass substrate to be coated is provided. The TCC is applied to a surface of the glass substrate that faces away from the viewer, i.e., towards the plasma television. The TCC may be applied via sputter coating or the like. The TCC sometimes may not be activated until the coated substrate is heat treated, e.g., using the conditions provided above. The now-coated glass substrate may be cut to size, and then the black and silver frits may be applied after the TCC is applied. Alternatively, the black and silver frits may be applied to the now-coated glass substrate, and it may then be cut to size.

The heat treatment may take place before or after the black and silver frits are applied. If the heat treatment takes place before the black and silver frits are applied, the black and silver frits may be fired together at a high temperature in another step so that they are melted. However, this high-temperature firing may be accomplished together with the tempering and/or the activation of the TCC. Accordingly, the black and silver frits may be melted and the heat treatment may take place after the cutting. Accordingly, it will be appreciated that certain example embodiments may enable a single heat treatment step to be used to activate the TCC and also melt the black and silver frits.

The black frit generally is non-conductive, whereas the silver frit generally is conductive. The black frit commonly used to form frames in vehicle front windshield applications may be used in connection with certain example embodiments, and/or the silver frit commonly used in vehicle backlite defogging applications may be used in connection with certain example embodiments. For example, the black frit used in certain example embodiments may be commercially available from Johnson Matthey under the trade name 2L52M400/IR738A, or may be commercially available from Ferro under the trade name 24-8844 Black in 1639. Also, for example, the silver frit used in certain example embodiments may be commercially available from BASF under the trade name Silver AP Inks.

Certain conventional EMI filters for plasma displays may utilize a Cu mesh and/or a Transparent Conductive Coating (TCC) for EMI blocking. In any configuration, it is advantageous to have a low resistance ohmic contact between the EMI blocking layer and the grounded metal frame to which the filter is attached. As noted above, the prior art approach for using a TCC EMI blocking layer involves screen printing a black peripheral frame layer along with a silver frit frame on a bare glass substrate cut to final filter size. This printing process is followed by the coating of the TCC, e.g. by magnetron sputtering or the like. Thus, in this filter structure, the frame layers are positioned between the glass and the EMI coating. As explained above, this approach is not cost-effective, as it involves coating small glass substrates.

In contrast to these prior art approaches, certain example embodiments of this invention relate to a filter structure that reduce cost by implementing a more cost-effective technique. That is, in certain example embodiments, the TCC is coated on large size glass substrates (e.g., on large stock sheets that typically are up to about 3.21 m×6 m sheets), the coated glass is subsequently cut to final filter size, and the conductive frame is screen printed on top of the TCC. Thus, the EMI coating is positioned between the glass and the frame layer(s) in the filter structure of certain example embodiments, unlike those of conventional TCC-based EMI filters.

Figure 16:
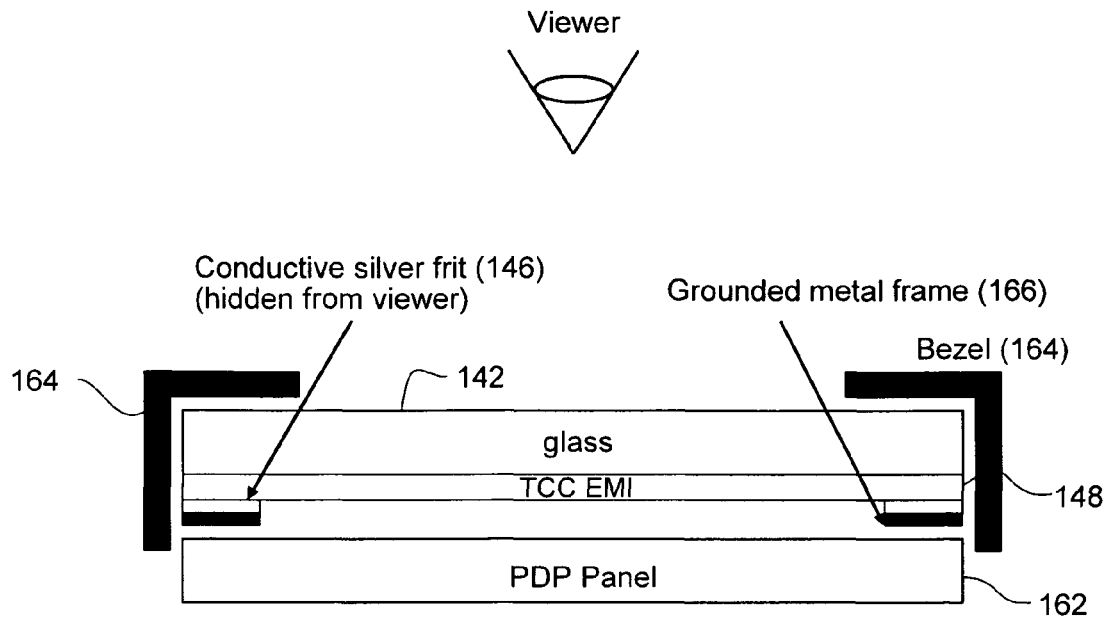
FIG. 16 is a cross sectional view of an illustrative plasma display assembly including a non-black frame that is substantially entirely concealed via a bezel according to an example embodiment.

For some filter applications, the conductive frame does not need to be black. For instance, this may be the case when the frame is substantially entirely hidden behind the display bezel, as shown, for example, in FIG. 16. In the example embodiment shown in FIG. 16, for example, a conventional silver frit or conductive paste may be used such as, for example, BASF BF-8366 A6174LE. In greater detail, FIG. 16 is a cross sectional view of an illustrative plasma display assembly including a non-black frame that is substantially entirely concealed via a bezel 164 according to an example embodiment. In FIG. 16, a TCC EMI filter 148 is provided on the glass substrate 142, and a PDP panel is provided on the TCC EMI filter 148 opposite the glass substrate 142. A conductive silver frit frame 146 is provided on the TCC EMI filter 148, and a grounded metal frame 148 is in contact with the conductive silver frit frame 146. As alluded to above, the bezel 164 substantially entirely conceals the conductive silver frit frame 146 and the grounded metal frame 148.

As noted above, in conventional prior art filters having a TCC, a black, non-conductive frame is printed first followed by a conductive silver frit. The TCC is deposited on top of the frame layer and makes good electrical contact with the silver frit. However, in some cases where the TCC is deposited first followed by the non-conductive black frame and the silver frit frame, there is no longer a low resistance contact between the TCC and the conductive silver frit. This may be unacceptable in some applications and also sometimes may lead to poor EMI blocking of the filter. Indeed, it would be desirable to lower sheet resistance to below about 0.2 Ω/square, more desirable to lower sheet resistance to lower than about 0.15 Ω/square, and still more desirable to lower sheet resistance to below about 0.01 Ω/square, as measured, for example, by a four-point probe directly or indirectly on the fired frit.

Figure 17:
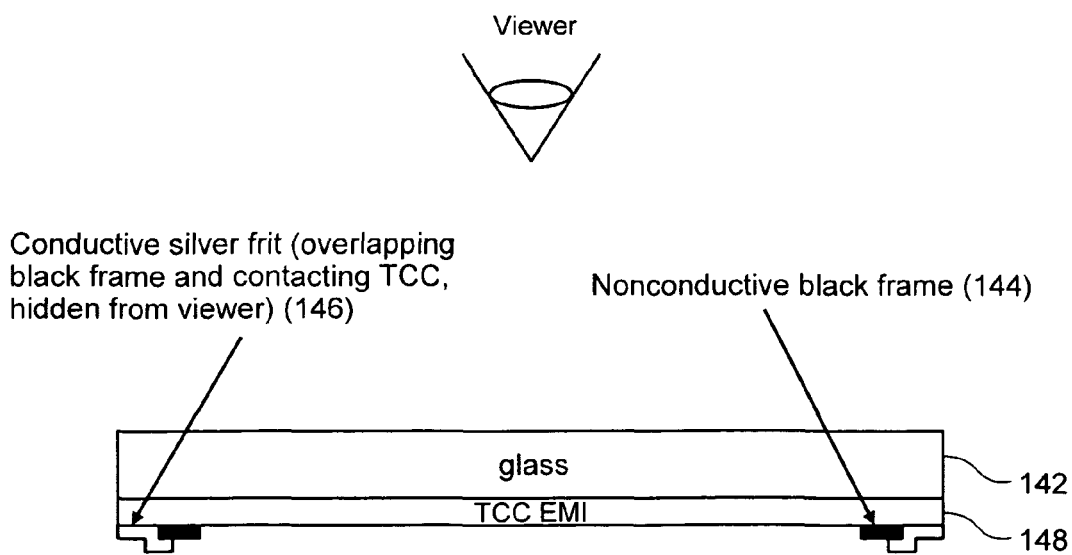
FIG. 17 is a cross sectional view of an illustrative plasma display assembly including concentric non-conductive black and conductive silver frames according to an example embodiment.

To reduce this problem while also providing low sheet resistances, certain example embodiments provide the arrangement shown in FIG. 17, which is a cross sectional view of an illustrative plasma display assembly including concentric non-conductive black 144 and conductive silver frames 146 according to an example embodiment. The conductive silver frit frame 146 is located at the periphery of the glass substrate on the TCC EMI filter 148. In certain example embodiments, the conductive silver frit frame 146 may be spaced apart from the black frame 144, thus forming a gap between the silver frit frame 146 and the black frame 144 such that the silver frit frame 146 is substantially not visible to the viewer whereas the black frame 144 may or may not be at least partially visible to the viewer. In certain example embodiments, the black frame 144 may be provided on the TCC EMI first so that when the silver frit frame 146 is applied, any excess is applied over the black frame 144, thereby substantially concealing it from the viewer. In certain example embodiments, the silver frit frame 146 may be provided on the glass substrate 142 prior to the black frame 144 being applied, provided that the silver frit frame 146 is substantially entirely hidden from the viewer.

It is sometimes not feasible or desirable to provide a large bezel. Thus, it is sometimes desirable to use an alternative arrangement that reduces the size of the bezel, e.g., by concealing the conductive silver frit frame 146 in different way. Accordingly, it will be appreciated that the example embodiment shown in FIG. 17 can accommodate smaller bezels, as the black frame 144 may help to conceal the silver frit frame 146. Additionally, the example embodiment shown in FIG. 17 preferably achieves a sheet resistance of less than about 0.2 Ω/square, more preferably less than about 0.15 Ω/square, and more preferably less than about 0.01 Ω/square, as measured, for example, by a standard four-point probe directly or indirectly on the fired frit. It is believed that the presence of the silver keeps the sheet resistance low and sometimes even negligible. Furthermore, it is believed that any other conductive material would cause an increased sheet resistance.

Figure 18:
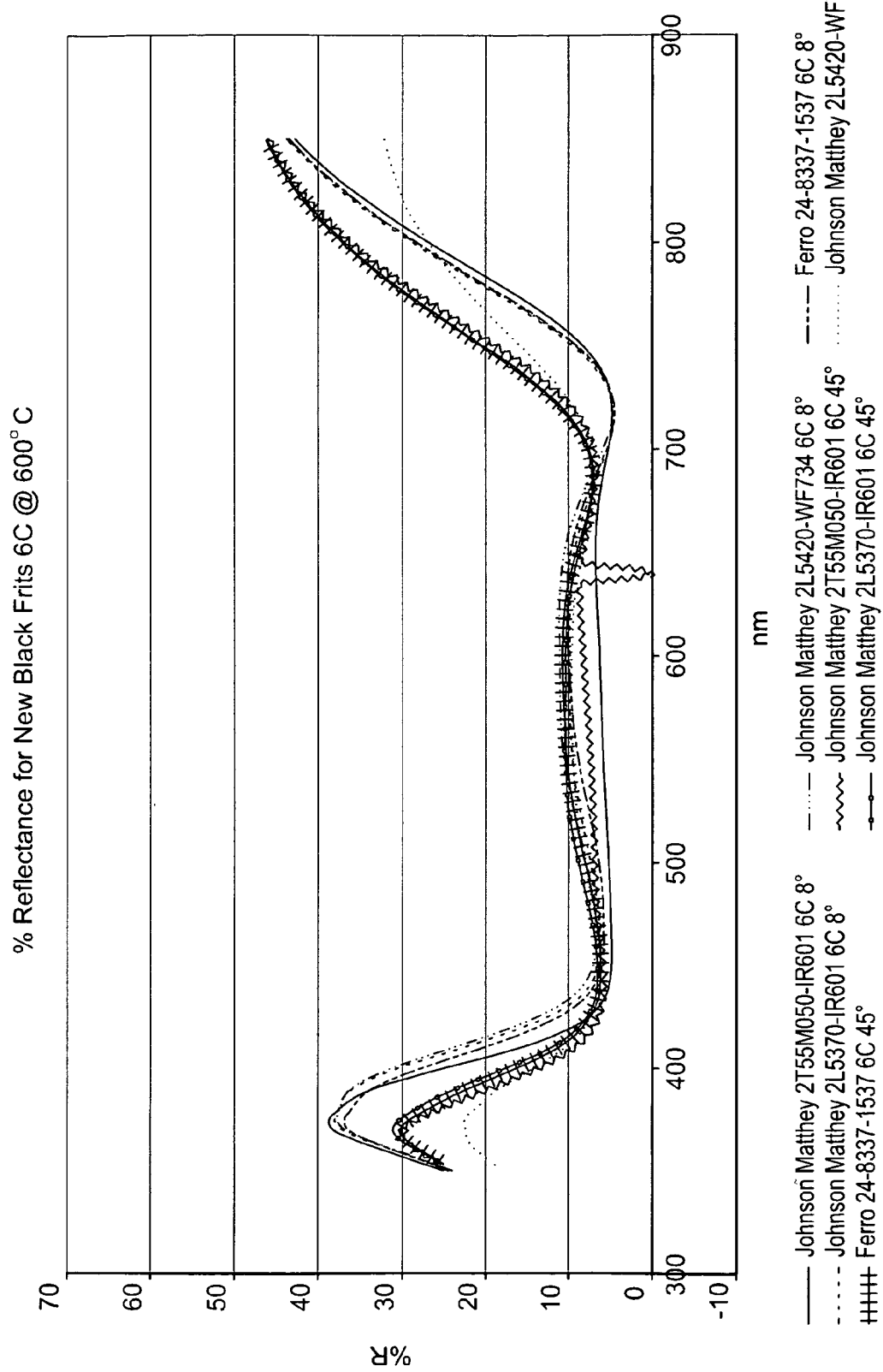
FIG. 18 shows percent reflectance in the visible spectrum for black frits through the glass usable in connection with certain example embodiments.

Non-conductive black frames considered to be acceptable for low reflection black coatings include, for example, Johnson-Matthey 2T55M050-IR601 and Ferro 24-8337-1537. Additionally, there are many non-conductive black enamels that may be used for this purpose. An example of the conductive layer is BASF BF-8366 A6174LE. Additionally, there are many silver inks available for this purpose. FIG. 18 shows percent reflectance in the visible spectrum for black frits usable in connection with certain example embodiments. That is, FIG. 18 plots the reflectance of several black frits through the glass on the TCC after firing at 600 degrees C. The percent reflectance of the black frits through the glass of certain example embodiments in the visible spectrum (e.g., about 400-700 nm) at 8 and 45 degree angles off of the glass substrate preferably is less than about 10%, more preferably less than about 8%, and still more preferably less than about 7%. It will be appreciated that the percent reflectance may be slightly higher when taken at an angle of 8 degrees off of the glass in comparison to when taken at an angle of 45 degrees off of the glass.

In certain example embodiments, the black frit may be applied before the silver frit. In certain example embodiments, the silver frit may be applied before the black frit, e.g., when the silver frit is concealed by the bezel of the plasma display device and/or otherwise substantially not visible to a viewer thereof.

Figure 19:
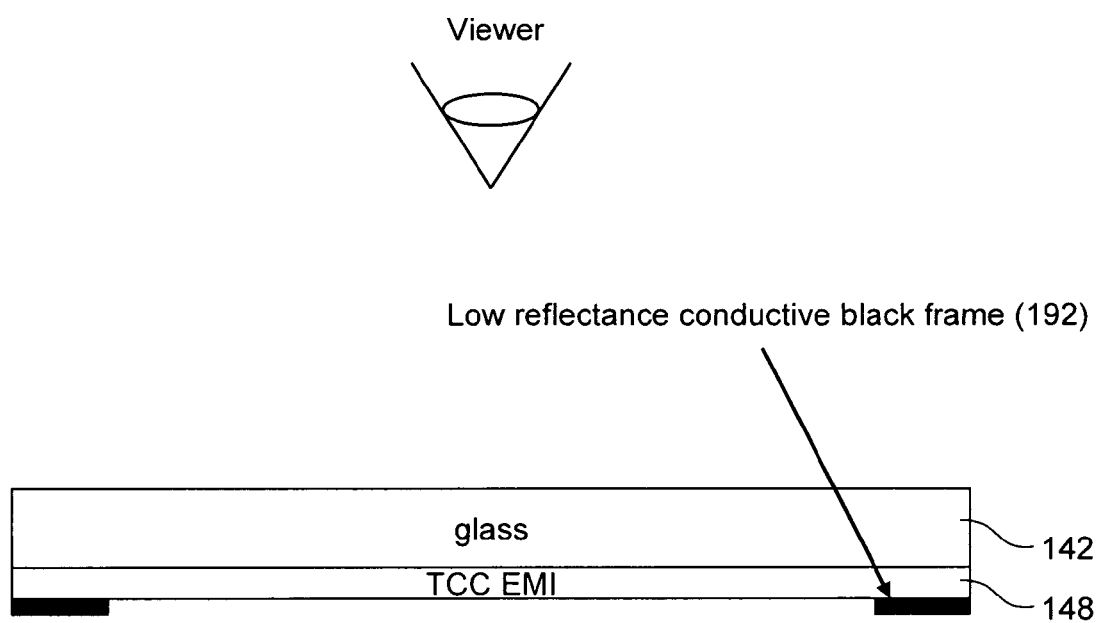
FIG. 19 is a cross sectional view of an illustrative plasma display assembly including a low reflectance conductive black frame according to an example embodiment.

The example embodiments described above have included separate silver and black frits. However, to further reduce cost of the filter, the functionality of the separate black and conductive frames may be combined into a single material. Such a material may be a conductive black frame layer, as shown, for example, in FIG. 19. In other words, FIG. 19 is a cross sectional view of an illustrative plasma display assembly including a low reflectance conductive black frame according to an example embodiment. As shown in FIG. 19, a glass substrate 142 has a TCC EMI filter 148 provided thereon. A low reflectance conductive black frame 192 is provided on the TCC EMI filter opposite the glass substrate. The low reflectance conductive black frame 192 of FIG. 19 replaces both the conductive silver frit frame and the black frame, as it is both conductive and aesthetically more acceptable than typical silver frit frames. Materials for black conductive frames are known and include, for example, that which is disclosed in co-pending and commonly assigned U.S. application Ser. No. 10/956,371. Of course, it will be appreciated that any conductive black material may be used in connection with certain example embodiments. For example, a suitable material may be a mixture comprising about 60% silver, with black constituting the majority of the remainder of the mixture and with other materials such as pigment modifiers, rheology modifiers, oxidation modifiers, and glass frit also forming a part of the mixture. It will be appreciated that more or less silver can be used, for example, in the range of about 50-70% silver, although the conductivity of the material is expected to drop-off below a certain threshold percentage of silver. The conductive black frit of certain example embodiments may be able to withstand temperatures used to conduct heat treatments (e.g., temperatures up to about 650 degrees C.). In general, conductive black frits according to certain example embodiments may be selected and/or mixed and optimized so as to have some or all of the properties that separate silver and black frits would have. Thus, for example, conductive black frits according to certain example embodiments may be selected and/or mixed and optimized to have the conductivity of or approaching that of a conventional silver frit and the black color of a conventional black frit, while also having a low reflectance when viewed through the glass.

The example embodiment shown in FIG. 19 preferably achieves a sheet resistance of less than about 0.2 Ω/square, more preferably less than about 0.15 Ω/square, and still more preferably less than about 0.01 Ω/square, as measured, for example, by a four-point probe directly or indirectly on the fired frit. As above, it is believed that the presence of the silver keeps the sheet resistance low and sometimes even negligible, and it is believed that any other conductive material would cause an increased sheet resistance. The conductive black material may be applied to various thicknesses. For example, the conductive black material may be applied to a thickness of about 20-60 μm, more preferably about 25-45 μm, and still more preferably about 30 μm.

The conductive black material and the TCC may be optimized with respect to each other, e.g., to obtain a low reflectance from the viewer side. For example, the percent reflectance of the conductive black frames through the glass of certain example embodiments in the visible spectrum (e.g., about 400-700 nm) at 8 and 45 degree angles off of the glass substrate preferably is less than about 10%, more preferably less than about 8%, and still more preferably less than about 7%. Again, it will be appreciated that the percent reflectance may be slightly higher when taken at an angle of 8 degrees off of the glass in comparison to when taken at an angle of 45 degrees off of the glass.

It will be appreciated that when viewed by a viewer through the TCC, the conductive black frame may not appear "black," sometimes resulting in a less aesthetically appealing color and/or other appearance of the frame from the viewer's perspective. This is related to the TCC's effect on the viewer's perception of the conductive black frame. Accordingly, the black conductive material and the TCC may be further optimized with respect to each other so that, when viewed by a viewer through the TCC, the conductive black frame actually appears to be "black" or at least "blacker." This may be accomplished in certain example embodiments by introducing pigment additives or coloring agents to the black material so that the black material looks "black" or at least "blacker" when viewed by a viewer through the TCC. In other words, the introduction of pigment additives or coloring agents to the black material may reduce perceived discoloration effects when the viewer views the conductive black material through the TCC.

The techniques described herein may be advantageous for a number of reasons. For example, a TCC may be coated on stock non-cut sheets, which often are the size of large sliding glass doors. In other words, the techniques of certain example embodiments reduce or eliminate the need to cut glass sheets to a desired size prior to applying an EMI filter thereon. This, in turn, reduces the amount of wasted product (e.g., reduces the amount of wasted glass and/or wasted sputtering material) and/or time (e.g., since products do not need to be carefully arranged to increase the area covered by glass to be coated on a conveyor), as a larger initial sheet may take advantage of substantially the entire bed size of a standard conveyor used for providing sputtered coatings. Additionally, large stock glass sheets tend not to fall between rollers and thus reduce the amount of breakage and/or damaging associated with smaller sheets that coated using other processes.

Certain example embodiments are also advantageous in that only one heat treatment needed. In other words, certain example embodiments enable a glass substrate to be heat treated, a coating to be activated, and frits to be melted in a single high temperature step.

Figure 1B:
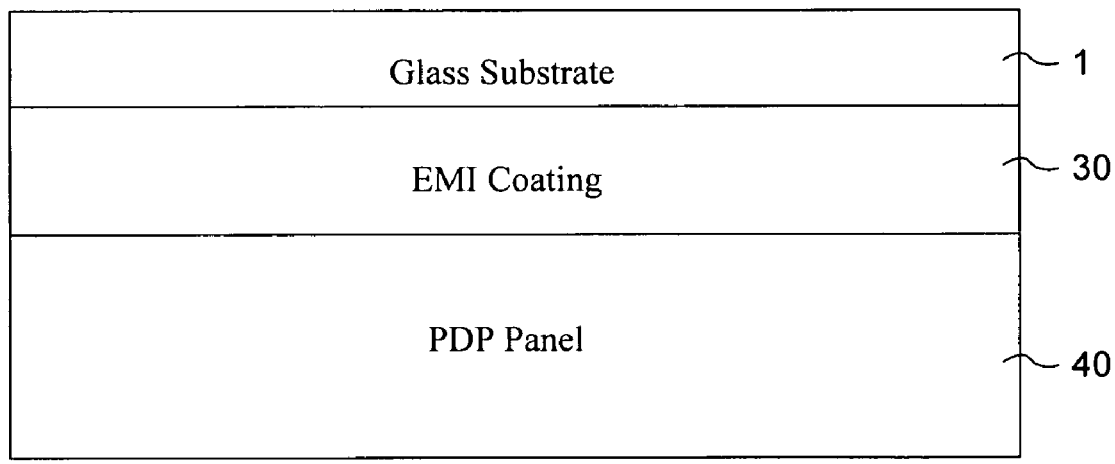

A description of the EMI filter alluded to above will now be provided. FIG. 1(*a*) is a cross sectional view of an EMI filter for use in a PDP panel (or other type of display panel) according to an example embodiment of this invention. FIG. 1(*b*) is a cross sectional view illustrating the filter of FIG. 1(*a*) on a PDP panel. As shown in FIG. 1(*b*), the filter of FIG. 1(*a*) is provided on the interior side (side facing away from the sun) of a front cover glass substrate at the front of the PDP. The EMI filters according to example embodiments of this invention may or may not be used in conjunctions with antireflection (AR) coatings. An AR coating may be provided on the cover glass, on the opposite or the same side as the EMI filter coating. The PDP panel 40 shown in FIG. 1(*b*) may be any suitable type of PDP panel. Example PDP panels are described in US 2006/0083938 (e.g., see FIG. 6), the entirety of which is incorporated herein by reference. For purposes of example, the FIG. 1(*a*) filter structure may be used in place of 100 or 100' in the PDP device of FIG. 6 of US 2006/0083938, as an example application of this invention.

The EMI filter structure of FIG. 1 includes cover glass substrate 1 (e.g., clear, green, bronze, or blue-green glass substrate from about 1.0 to 10.0 mm thick, more preferably from about 1.0 mm to 3.5 mm thick), and EMI filter coating (or layer system) 30 provided on the substrate 1 either directly or indirectly. The coating (or layer system) 30 includes: dielectric silicon nitride base layer 3 which may be $Si_3N_4$, of the Si-rich type for haze reduction, or of any other suitable stoichiometry in different embodiments of this invention, high index titanium oxide inclusive layer 4, first lower contact layer 7 (which contacts conductive EMI shielding layer 9), first conductive and preferably metallic EMI shielding layer 9, first upper contact layer 11 (which contacts layer 9), dielectric or conductive metal oxide layer 13 (which may be deposited in one or multiple steps in different embodiments of this invention), second lower contact layer 17 (which contacts EMI shielding layer 19), second conductive and preferably metallic EMI shielding layer 19, second upper contact layer 21 (which contacts layer 19), dielectric or conductive metal oxide layer 23, dielectric silicon nitride based layer(s) 25, 26 which may be $Si_3N_4$, of the Si-rich type for haze reduction, or of any other suitable stoichiometry in different embodiments of this invention, second high index titanium oxide inclusive layer 24, third lower contact layer 27 (which contacts conductive EMI shielding layer 29), third conductive and preferably metallic EMI shielding layer 29, third upper contact layer 31 (which contacts layer 29), dielectric or conductive metal oxide layer 33 (which may be deposited in one or multiple steps in different embodiments of this invention), fourth lower contact layer 37 (which contacts EMI shielding layer 39), fourth conductive and preferably metallic EMI shielding layer 39, fourth upper contact layer 41 (which contacts layer 39), dielectric or conductive metal oxide layer 43, and protective overcoat layer 45 of or including silicon nitride or the like. The "contact" layers 7, 11, 17, 21, 27, 31, 37 and 41 each contact at least one EMI shielding/reflecting layer (e.g., layer based on Ag) (9, 19, 29, 39). The aforesaid layers 3-45 make up the EMI shielding coating 30 which is provided on substrate I for blocking substantial amounts of EMI from being emitted from the PDP device. Example sheet resistances are 0.8, 1.2 and 1.6 ohm/sq. for the coatings 30 in different example embodiments. In certain example embodiments, the coating 30 may have a sheet resistance of from about 0.5 to 1.8 ohms/sq.

An alternative (not shown) to the FIG. 1 embodiment involves splitting each of metal oxide layers 13 and 33 into two different layers and provided a silicon nitride based layer in between the split layers. In other words, for example, tin oxide based layer 13 would be replaced with a first tin oxide based layer 13', a silicon nitride layer 13" and a second tin oxide based layer 13'". Likewise, tin oxide based layer 33 would be replaced with a first tin oxide based layer 33', a silicon nitride layer 33" and a second tin oxide based layer 33'". This alternative layer stack is particularly advantageous with respect to heat treated and heat treatable filters that may be used when, for example, bus bar/black frit is applied on top of the coating 30. In such embodiments, the use of the NiCrOx material for layers 11, 21, 31 and 41 is advantageous in that it is more durable and provides for better thermal stability compared to other possible materials such as zinc oxide or zinc aluminum oxide.

Dielectric layers 3, 25, 26 and 45 preferably have a refractive index (n) of from about 1.9 to 2.1, more preferably from about 1.97 to 2.08, and may be of or include silicon nitride in certain embodiments of this invention. Silicon nitride layers 3, 25, 26 and 45 may, among other things, improve heat-treatability of the coated articles, e.g., such as thermal tempering or the like. The silicon nitride of one, two or all of these layers may be of the stoichiometric type ($Si_3N_4$) type, or alternatively of the Si-rich type in different embodiments of this invention. For example, Si-rich silicon nitride 3, 26 combined with zinc oxide inclusive layer 7 (and/or 27) under a silver based EMI shielding layer 9 (and/or 29) may permit the silver to be deposited (e.g., via sputtering or the like) in a manner which causes its sheet resistance to be lessened compared to if certain other material(s) were under the silver (and thus, EMI shielding to be improved). Moreover, the presence of free Si in a Si-rich silicon nitride inclusive layer 3 may allow certain atoms such as sodium (Na) which migrate outwardly from the glass 1 during HT to be more efficiently stopped by the Si-rich silicon nitride inclusive layer before they can reach the silver and damage the same. Thus, it is believed that the oxidation caused by heat treatment allows visible transmission to increase, and that the Si-rich $Si_xN_y$ can reduce the amount of damage done to the silver layer(s) during HT in certain example embodiments of this invention thereby allowing sheet resistance ($R_s$) to decrease in a satisfactory manner and EMI shielding to be improved. In certain example embodiments, when Si-rich silicon nitride us used in layer(s) 3 and/or 25, 26, the Si-rich silicon nitride layer as deposited may be characterized by $Si_xN_y$ layer(s), where x/y may be from 0.76 to 1.5, more preferably from 0.8 to 1.4, still more preferably from 0.85 to 1.2. Moreover, in certain example embodiments, before and/or after HT the Si-rich $Si_xN_y$ layer(s) may have an index of refraction "n" of at least 2.05, more preferably of at least 2.07, and sometimes at least 2.10 (e.g., 632 nm) (note: stoichiometric $Si_3N_4$ which may also be used has an index "n" of 2.02-2.04). In certain example embodiments, it has surprisingly been found that improved thermal stability is especially realizable when the Si-rich $Si_xN_y$ layer(s) as deposited has an index of refraction "n" of at least 2.10, more preferably of at least 2.2, and most preferably from 2.2 to 2.4. Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0). Again, in certain example embodiments, it has surprisingly been found that improved thermal stability can be realized when "k" for the Si-rich $Si_xN_y$ layer is from 0.001 to 0.05 as deposited (550 nm). It is noted that n and k tend to drop due to heat treatment. Any and/or all of the silicon nitride layers (3, 25, 26, 45) discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention. These layers are provided in order to improve the reflection of EMI without sacrificing visible transmission.

High index layers 4 and 24 are preferably of or including an oxide of titanium (e.g., $TiO_2$, or other suitable stoichiometry) in certain example embodiments of this invention. Layers 4 and 24 preferably have a refractive index (n) of at least about 2.2, more preferably of at least about 2.3, 2.4 or 2.45, in certain example embodiments of this invention. These layers 4 and 24 may be conductive or dielectric in different example embodiments of this invention. These layers are provided in order to improve the reflection of EMI without sacrificing visible transmission.

EMI shielding/reflecting layers 9, 19, 29 and 39 are preferably substantially or entirely metallic and/or conductive, and may comprise or consist essentially of silver (Ag), gold, or any other suitable EMI reflecting material. EMI shielding layers 9, 19, 29 and 39 help allow the coating to have good conductivity and block EMI from being emitted from the PDP panel. It is possible for these layers to be slightly oxidized in certain embodiments of this invention.

The upper contact layers 11, 21, 31 and 41 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ in these layers allows durability to be improved. The $NiCrO_x$ of layers 11 and/or 21 may be fully oxidized in certain embodiments of this invention (i.e., fully stoichiometric), or alternatively may only be partially oxidized. In certain instances, the $NiCrO_x$ layers may be at least about 50% oxidized. These layers (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer, and these contact layers may or may not be continuous in different embodiments of this invention across the entire IR reflecting layer. The use of the NiCrOx material for one, two, three or all of layers 11, 21, 31 and 41 is advantageous in that it is more durable and provides for better thermal stability compared to other possible materials such as zinc oxide or zinc aluminum oxide. This is especially the case with respect to heat treated and heat treatable filters that may be used when, for example, bus bariblack frit is applied on top of the coating 30 in certain applications.

Metal oxide layers 13, 23, 33 and 43 may be of or include tin oxide in certain example embodiments of this invention. These layers preferably have a refractive index (n) of from about 1.9 to 2.1 in certain example embodiments of this invention, more preferably from about 1.95 to 2.05. These layers may be doped with other material such as zinc in certain instances. However, as with other layers herein, other materials may be used in different instances. These layers are provided in order to improve the reflection of EMI without sacrificing visible transmission.

Lower contact layers 7, 17, 27 and 37 in certain embodiments of this invention are of or include zinc oxide (e.g., ZnO). The zinc oxide of these layers may contain other materials as well such as Al (e.g., to form $ZnAlO_x$). For example, in certain example embodiments of this invention, one or more of these zinc oxide layers may be doped with from about 1 to 10% Al, more preferably from about 1 to 5% Al, and most preferably about 2 to 4% Al. The use of zinc oxide under the silver 9, 19, 29, 39 allows for an excellent quality of silver to be achieved thereby improving conductivity and improving EMI shielding.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate I even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

In certain example embodiments of this invention, the Ag-based EMI shielding layers in the coating have different thicknesses. This is by design, and is particularly advantageous. The different thicknesses of the silver based layers 9, 19, 29, 39 are optimized to obtain a low visible reflection as seen from outside of the PDP apparatus (i.e., from the glass side of the film, in most embodiments, namely when the coating 30 is on the interior surface of the substrate 1 facing the plasma), and at the same time permitting high visible transmittance. Silver layers buried deeper in the stack (i.e., further from the plasma) are masked to a certain extent by the absorption in the preceeding layers; therefore, they can be made thicker to improve EMI shielding without adversely affecting outside reflectance to any significant extent. Thus, the thickness (physical thickness) of a silver based EMI shielding layer(s) (e.g., 39) further from the plasma of the PDP panel can be significantly thicker than the thickness of a silver based EMI shielding layer(s) (e.g., 9) closer to the plasma of the PDP panel. The total silver thickness is unevenly distributed across the coating 30 in order to take advantageous of this effect. The total thickness of all silver based layers (9, 19, 29, 39) combined may be from about 25-80 nm in certain example embodiments of this invention, more preferably from about 30-70 nm, whereas the total thickness of the entire coating 30 may be from about 300 to 400 nm, more preferably from about 325 to 380 nm, and most preferably from about 330 to 375 in certain example embodiments of this invention. In certain example embodiments, the thickness (physical thickness) of a silver based EMI shielding layer(s) (e.g., 39 or 29) further from the plasma of the PDP panel is at least about 1 nm thicker (more preferably at least about 2 nm thicker, and possibly at least about 3 or 4 nm thicker) than the thickness of a silver based EMI shielding layer(s) (e.g., 9) closer to the plasma of the PDP panel.

Figure 2:
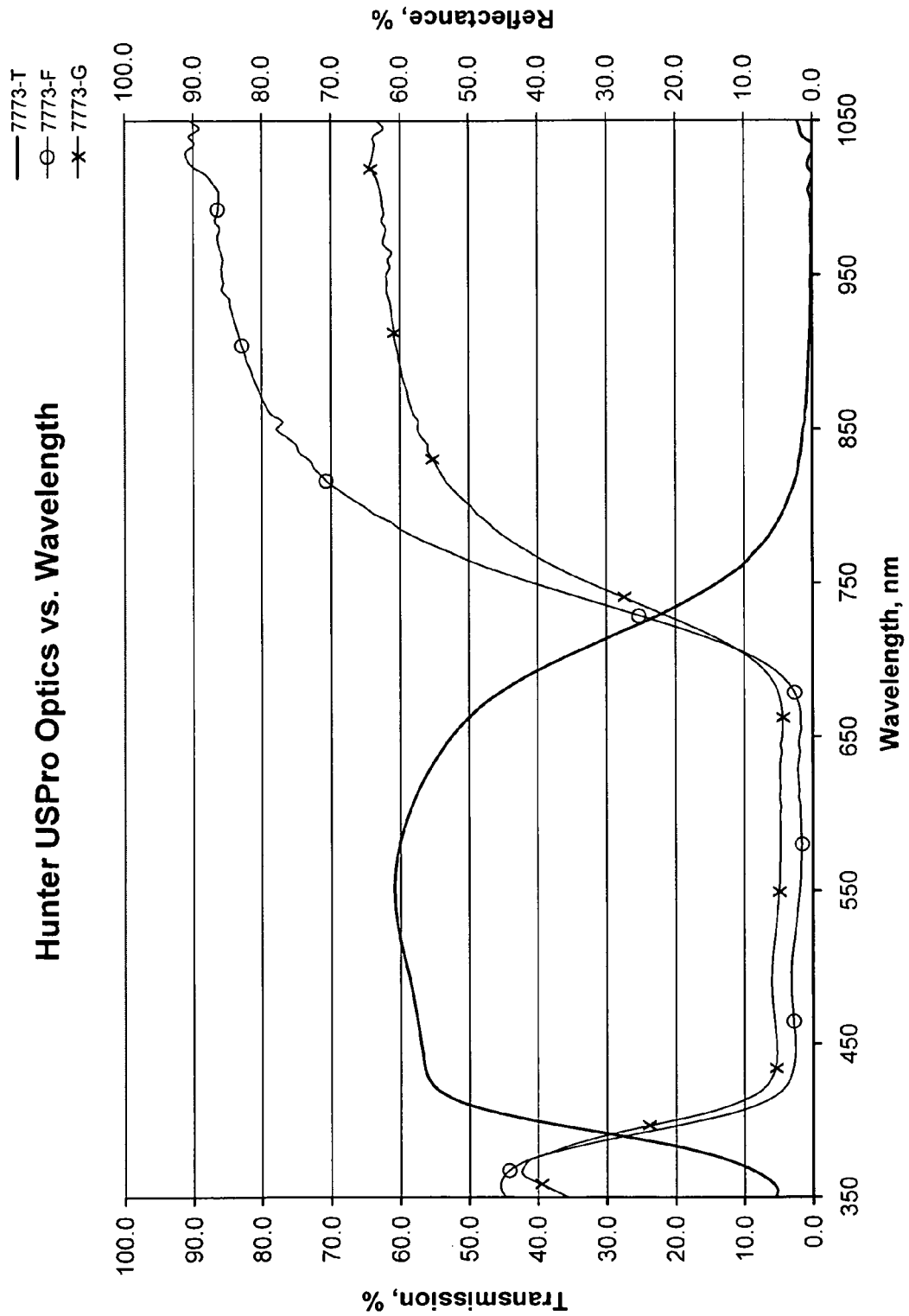
FIG. 2 is a transmission/reflectance vs. wavelength graph illustrating optical characteristics of the filter of FIG. 1(a) according to an example embodiment of this invention.

FIG. 2 is a transmission/reflectance vs. wavelength graph illustrating optical characteristics of the filter of FIG. 1(a) when designed for a sheet resistance of 0.8 ohms/square, thereby having thick silver layer(s). In FIG. 2, T stands for transmission, G stands for glass side reflectance, and F stands for film side reflectance. It can be seen in FIG. 2 that film side (i.e., the side closest to the plasma) reflectance of EMI such as NIR is enhanced (much reflectance) while visible transmission (e.g., from 450-650 nm) is kept high. This provides for a filter having good/high visible transmission, but much reflectance/absorption in the NIR region where undesirable wavelengths are present. In certain example embodiments, the combination of the coating 30 and the substrate 1 have a visible transmission of at least about 50%, more preferably of at least about 55%, 58% or 60% in certain example embodiments of this invention.

Figure 3:
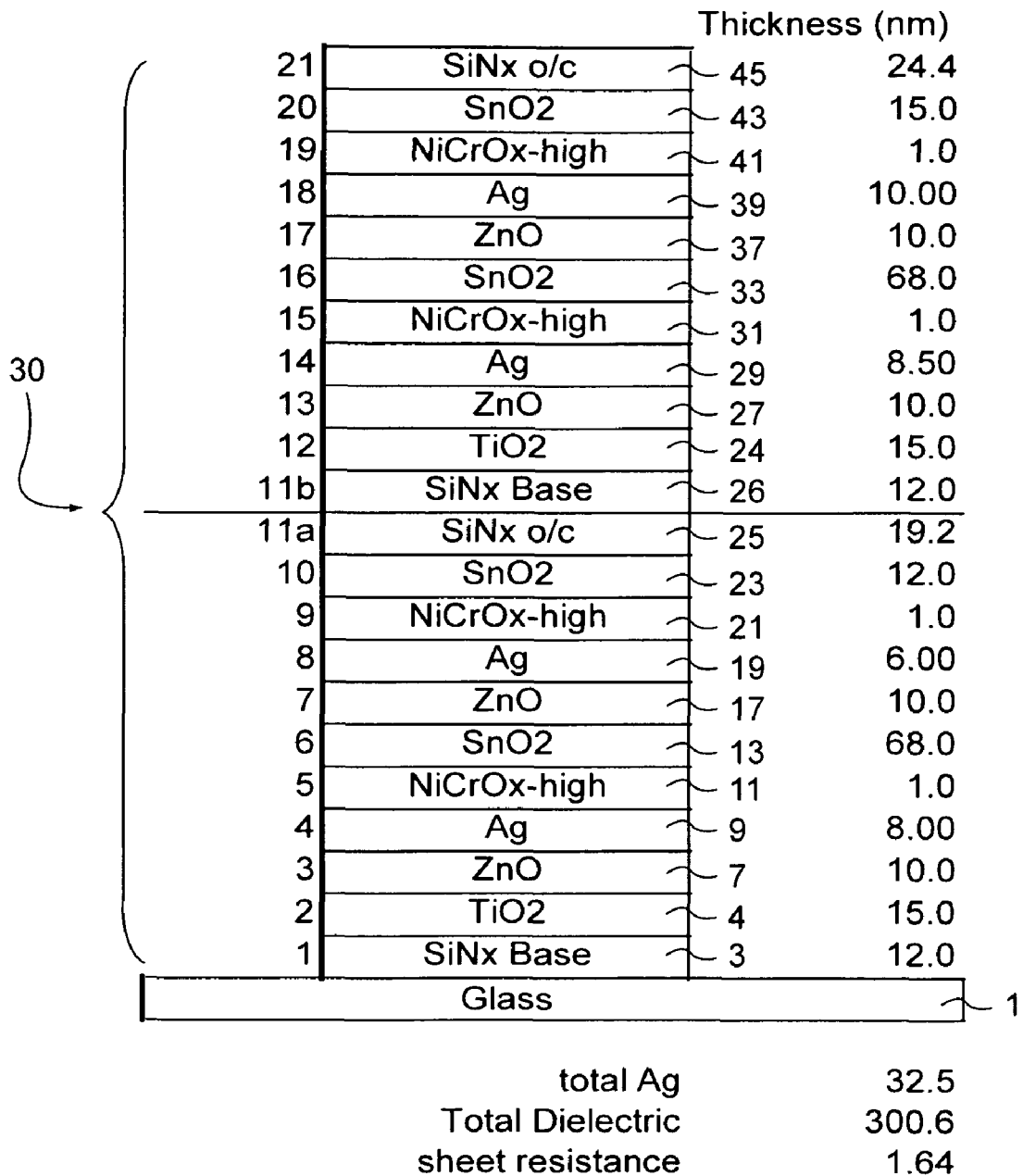
FIG. 3 is a cross sectional view of an EMI filter for a display panel (e.g., PDP panel) according to another example embodiment of this invention.

FIG. 3 is a cross sectional view of an EMI filter for a display panel (e.g., PDP panel) according to another example embodiment of this invention. The FIG. 3 embodiment is the same as the FIG. 1(a)-(b) embodiment discussed above, except that certain thicknesses are different because the FIG. 3 filter is designed for a higher sheet resistance (Rs of 1.64 ohms/square).

While various thicknesses and materials may be used in layers in different embodiments of this invention, example thicknesses and materials for the respective layers on the glass substrate 1 in the FIG. 1-3 embodiments are as follows, from the glass substrate outwardly:

| Example Materials/Thicknesses; FIG. 1-3 Embodiment | | | |
| --- | --- | --- | --- |
| Layer<br>Glass (1-10 mm thick) | Preferred Range (nm) | More Preferred (nm) | Example (nm) |
| $Si_xN_y$ (layer 3) | 4-30 | 8-15 | 10-14 |
| $TiO_x$ (layer 4) | 4-35 | 8-20 | 15 |
| $ZnO_x$ (layer 7) | 4-22 | 5-15 | 10 |
| Ag (layer 9) | 4-20 | 6-15 | 8-13 |
| $NiCrO_x$ (layer 11) | 0.3-4 | 0.5-2 | 1 |
| $SnO_2$ (layer 13) | 10-100 | 25-90 | 55-80 |
| $ZnO_x$ (layer 17) | 4-22 | 5-15 | 10 |
| Ag (layer 19) | 4-24 | 6-20 | 8-18 |
| $NiCrO_x$ (layer 21) | 0.3-4 | 0.5-2 | 1 |
| $SnO_2$ (layer 23) | 4-25 | 6-20 | 10-14 |
| $Si_3N_4$ (layer 25) | 10-50 | 12-40 | 15-25 |
| $Si_xN_y$ (layer 26) | 4-30 | 8-15 | 10-14 |
| $TiO_x$ (layer 24) | 4-35 | 8-20 | 15 |
| $ZnO_x$ (layer 27) | 4-22 | 5-15 | 10 |
| Ag (layer 29) | 8-30 | 10-24 | 12-22 |
| $NiCrO_x$ (layer 31) | 0.3-4 | 0.5-2 | 1 |
| $SnO_2$ (layer 33) | 10-100 | 25-90 | 55-80 |
| $ZnO_x$ (layer 37) | 4-22 | 5-15 | 10 |
| Ag (layer 39) | 8-30 | 10-24 | 11-20 |
| $NiCrO_x$ (layer 41) | 0.3-4 | 0.5-2 | 1 |
| $SnO_2$ (layer 43) | 4-25 | 6-20 | 10-18 |
| $Si_3N_4$ (layer 45) | 10-50 | 15-40 | 18-32 |

In another example embodiment of this invention, FIG. 4 describes an Ag based TCC coating for use as an EMI filter in PDP applications of the like as discussed above, the FIG. 4 coating 30 including four layer stacks of ZnOx/Ag/NiCrOx sandwiched between metal oxides and nitrides. The FIG. 4 coating has different thicknesses than the coating of FIGS. 1-3, and also in FIG. 4 the layers 3, 25, 26, 24, 43 from the FIG. 1-3 embodiments have been removed. This shows that all layers in the FIG. 1 embodiment are not essential, and some may be removed in certain instances. This FIG. 4 coating 30 may have a sheet resistance less than 1.5 ohm/sq and 1.0 ohm/sq measured as coated and after heat-treatment, respectively, in certain example embodiments, and a neutral transmission in visible higher than 55% or 60% in certain example embodiments. The sheet resistance can be further reduced through the trade-off of transmission in visible by increased Ag thickness. If a lower transmission is desired, the transmission can be reduced by increased NiCrOx thickness and/or reduced x value. Metal oxides and nitrides should have optical index in visible higher than 1.8, and can be nonconductive such as SiNx or conductive such as ZnAlOx in different example embodiments. A multiple layer structure can also be used to replace each metal oxide, nitride, or oxynitride, such as replacing TiOx by SiNx/TiOx or SnOx by SnOx/SiNx/ZnOx.

Figures 4, 5, 6, 7, 8:
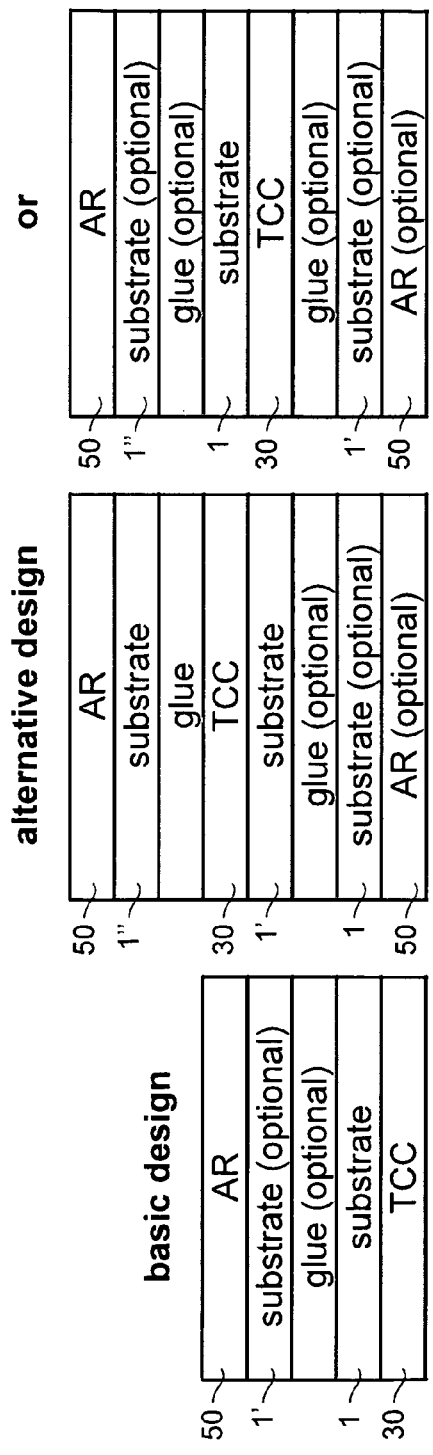
FIG. 4 is a listing of the layers of an EMI filter for a display panel (e.g., PDP panel) according to another example embodiment of this invention.
FIG. 5 is a listing of the layers of an example antireflection (AR) coating which may optionally be used in conjunction with an EMI coating in certain example embodiments of this invention.
FIG. 6 is a cross sectional view of the EMI filter (TCC) (of any embodiment of this invention), front cover glass, and optional AR coating for use at the front of a PDP panel according to an example embodiment of this invention.
FIG. 7 is a cross sectional view of the EMI filter (TCC) (of any embodiment of this invention), front cover glass, and a pair of optional AR coatings for use at the front of a PDP panel according to another example embodiment of this invention.
FIG. 8 is a cross sectional view of the EMI filter (TCC) (of any embodiment of this invention), front cover glass, and a pair of optional AR coatings for use at the front of a PDP panel according to another example embodiment of this invention.
Figures 9, 10:
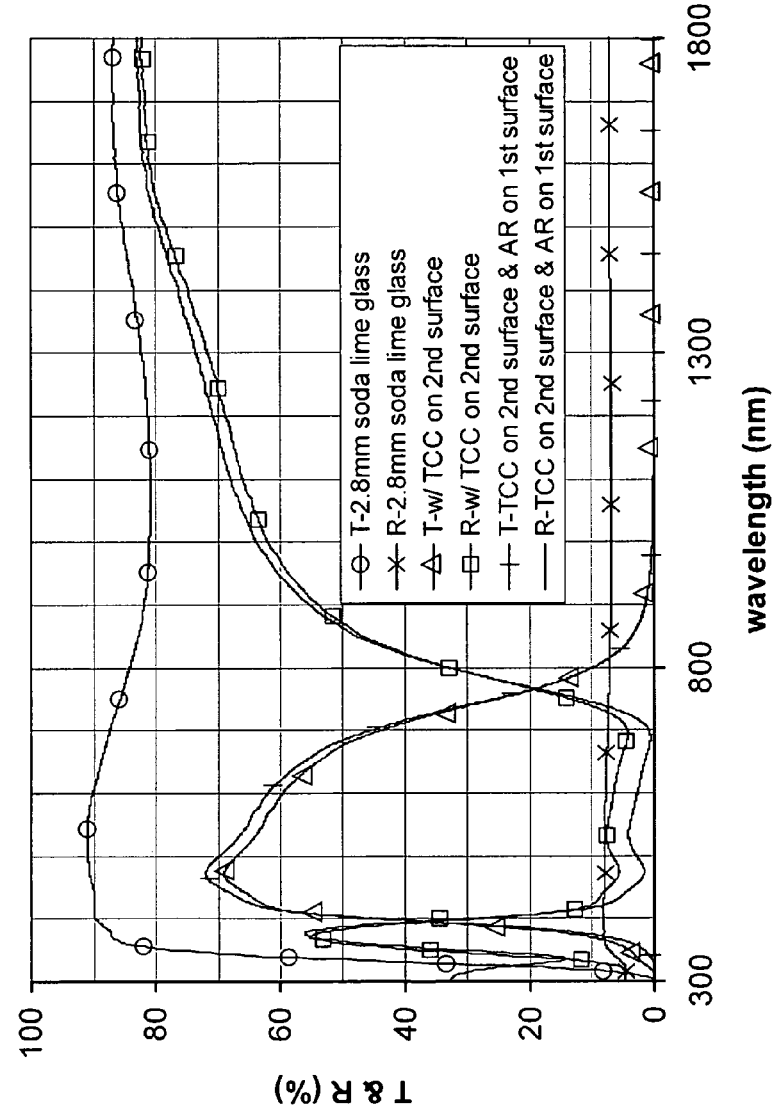
FIG. 9 is a table listing example optical characteristics of filter structures of certain example embodiments of this invention.
FIG. 10 is a transmission (T)/reflectance (R) vs. wavelength graph illustrating optical characteristics of the filters according to various example embodiments of this invention.

Referring to FIG. 5, a broad band visible antireflection (AR) coating 50, such as the one described in FIG. 5 or any other suitable AR coating, can be applied on the opposite surface of the substrate 1 (see FIGS. 6-8) and/or laminated atop of the TCC 30 (see FIGS. 7-8) to further enhance the optical performance of the Ag based EMI protection coating 30 in certain example embodiments of this invention. Examples of using this Ag based TCC coating for display applications are shown in FIGS. 6-8. As explained above, the various FIG. 6-8 filter structures may be used in place of 100 or 100' in the PDP device of FIG. 6 of US 2006/0083938, in example applications of this invention. Note that in FIGS. 6-8, optional additional substrate(s) 1', 1" may be glass or plastic, and the glue may be any suitable adhesive or the like. For example, in one example, a TCC coating 30 having 4 layers of Ag (as shown in FIGS. 1(a), 3 and 4) is used as part of cover glass 1 structure for outdoor display applications, and FIGS. 6-8 illustrate example designs of this cover glass structure with the optional possibility of using it together with an AR coating 50. Optical performance of example is summarized in FIG. 9 when TCC 30 (e.g., see FIG. 4, or FIG. 1) and AR (e.g., see FIG. 5) are coated on opposite surfaces of the substrate 1. Transmission and reflection spectra details are shown in FIG. 10. As with other embodiments herein, the TCC EMI filter coating 30 provides the following functions/advantages: reduces damage from EMI radiation through highly conductive Ag layers, block significant amounts of NIR and IR radiation from outdoor sunlight to reduce panel temperature, and enhances contrast ratio through reduced reflection.

Figures 11, 12:
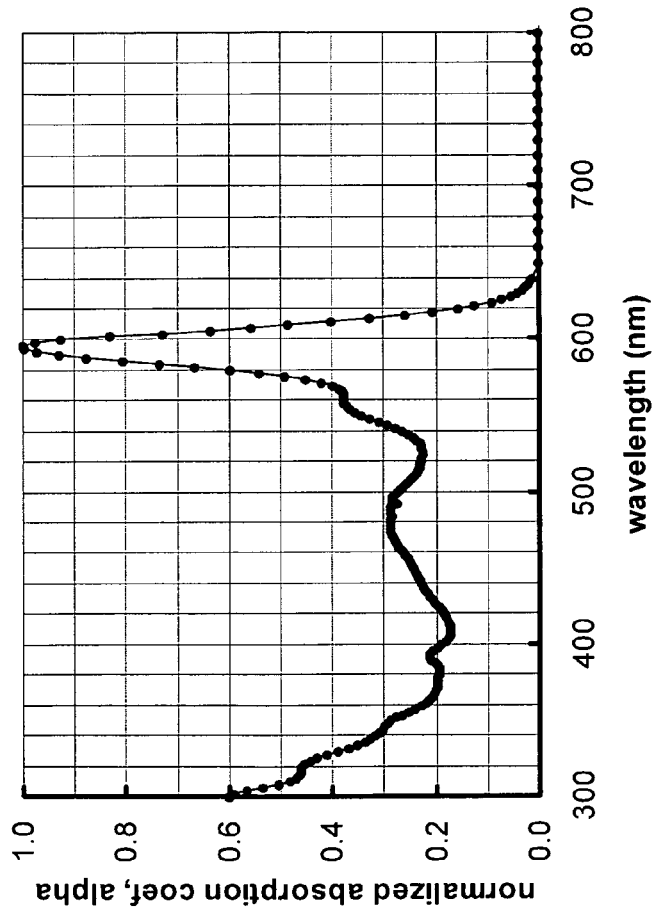
FIG. 11 is a graph illustrating normalized absorption spectrum of example optional pink dye which may be used in certain example embodiments of this invention.
FIG. 12 is a table listing example optical characteristics of filter structures of certain example embodiments of this invention which include the use of dye.
Figure 13:
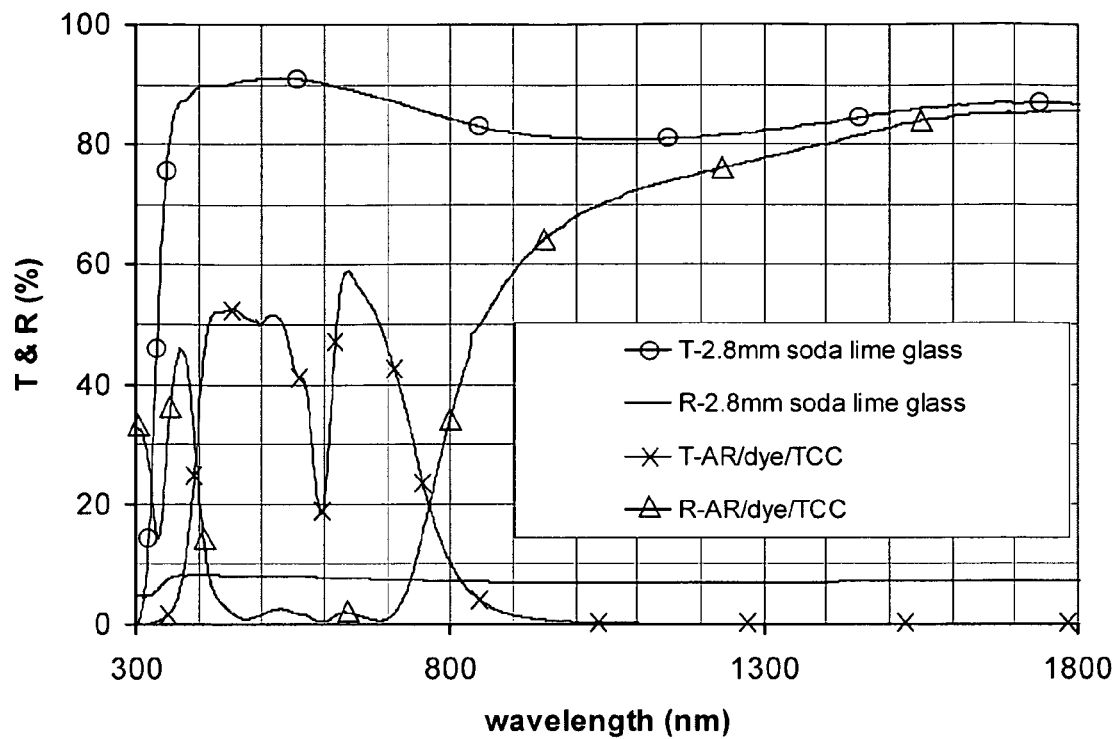
FIG. 13 is a transmission (T)/reflectance (R) vs. wavelength graph illustrating optical characteristics of the filters according to various example embodiments of this invention which include the use of dye.

Referring to FIGS. 11-13, another example of this invention is similar to the embodiments of FIGS. 1-10, but also includes an extra dye(es) based absorption layer(s) to reduce transmission at about 595 nm (as shown in FIG. 11) to improve color neutrality for plasma display applications. In certain example embodiments, the dye is for absorbing at selected wavelength ranges, but not other ranges. For example in certain example embodiments, the dye may absorb light proximate 595 nm (e.g., see FIG. 11) in order to improve color characteristics of PDP devices. The dye inclusive layer (not shown) can be introduced into one or more locations, such as between AR coating 50) and substrate (1), or between TCC 30 and substrate 1, or between TCC 30 and the glue layer, or embedded in the glue layer or substrate(s) 1 (see FIGS. 6-8). The optical performance of an example of this dye inclusive embodiment for PDP devices is shown in FIG. 12, and transmission and reflection spectra of an example of this embodiment are shown in FIG. 13. In this cover glass structure, the TCC coating 30 provides the following functions: block the emitting of EMI radiation from plasma panel by highly conductive Ag layers, block NIR and IR radiation from sunlight to reduce panel temperature for outdoor usage, enhance contrast ratio through reduced reflection, and block the emitting of NIR (850-950 nm) radiation from plasma panel to avoid the interference to nearby electronics.

In view of the above, it is clear that EMI filters for PDPs may use a transparent conductive coating (TCC) for EMI and NIR blocking, and it is also clear that it is desirable to have a low resistance ohmic contact between the EMI blocking layer and the grounded metal frame of the TV to which the filter is attached. Also as noted above, although the use of a conductive black frit has been successfully implemented by the assignee of the instant invention, further improvements are still possible.

Accordingly, certain example embodiments of this invention include a TCC EMI filter for PDP displays that does not require a conductive frame. Thus, it will be appreciated that such embodiments are less costly to produce.

The TCC in an EMI filter may include multiple layers (e.g., three or four layers) of silver between top and bottom dielectrics (insulators). The top and bottom layers are dielectrics (insulators) such as, for example, tin oxide (SnO2 or other suitable stoichiometry) and SiNx. An example TCC EMI filter that has been successfully used in connection with designs that require bus bars is disclosed in FIG. 20. The layer stack in FIG. 20 is very similar to the layer stack shown in FIGS. 14-19 of U.S. application Ser. No. 12/230,033, the entire contents of which is incorporated herein by reference and, indeed, exhibits similar properties. The example layer stack in FIG. 20 of the instant application was heat treated at 600 degrees C. for 10 minutes. The layer stack in FIG. 20 has a visible transmission of at least about 60% (more preferably at least about 62 or 63%), following HT. Additionally, the coating of FIG. 20 has a sheet resistance (Rs) of no more than about 1.3 or 1.2 ohms/square (more preferably of no more than about 1.0, and still more preferably of no more than about 0.90).

When the TCC EMI filter of FIG. 20 is mounted into a plasma TV without a conductive frame, the top dielectrics (e.g., $SnO_2$ and SiNx) prevent a low resistance contact between the metal frame in the television and the conductive silver layers in the TCC. Surprisingly and unexpectedly, however, despite this contact resistance, the filter of FIG. 20 has been found to pass EMI testing in most of the frequency range required for plasma television applications. That is, surprisingly and unexpectedly, despite this contact resistance, the filter of FIG. 20 has been found to pass EMI testing throughout most of the frequency range of from about 30 to 1000 MHz. Still more particularly, from about 60 to 1000 MHz, the EMI blocking capability is the same for filters with and without a conductive frame. The inventors of the instant application have determined, however, that it is in the frequency range of from about 30 to 60 MHz that the EMI signal from the plasma television exceeds the limit of 40 dBuV/m during standard CISPR-13 testing conditions. As is known, the CISPR-13 standard is published by the International Electrotechnical Commission, and describes the methods of measurement applicable to sound and television receivers or associated equipment and specifies limits for the control of disturbance from such equipment.

Figure 21:
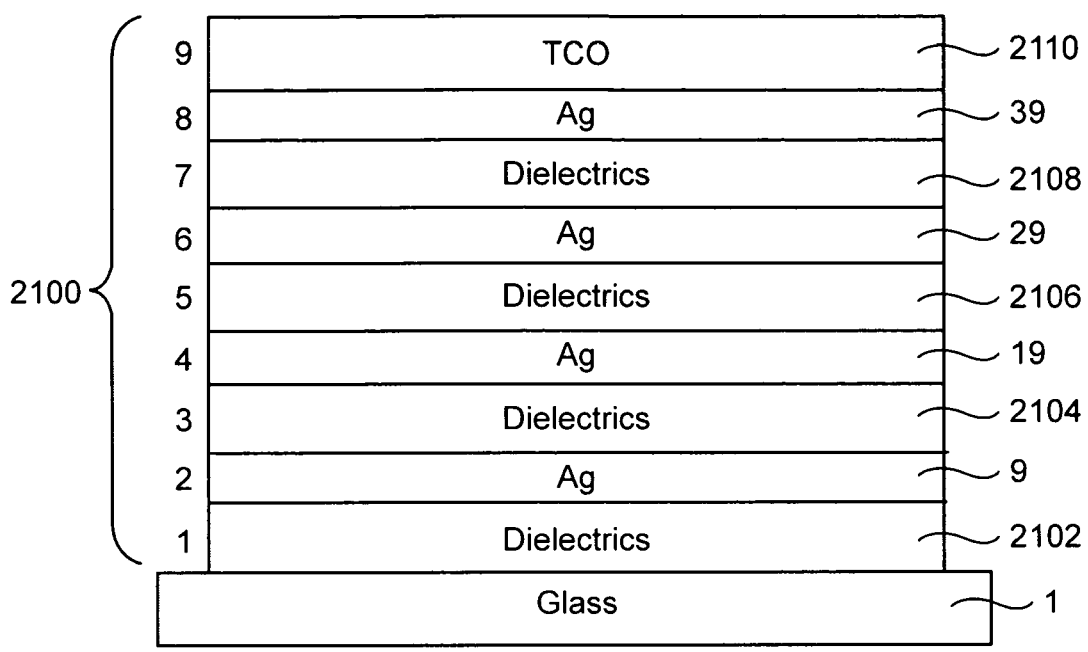
FIG. 21 is a cross sectional view of an EMI filter for a plasma display panel (e.g., PDP panel) that does not necessarily require a conductive bus bar or conductive frame according to an example embodiment of this invention.

Certain example embodiments address the shortcomings of filters like the one shown in FIG. 20, e.g., by helping to ensure that EMI blocking requirements are passed throughout the entire frequency range of interest. That is, certain example embodiments help ensure that EMI blocking requirements are passed throughout the entire frequency range from about 30 to 1000 MHz. This may be accomplished in certain example embodiments by replacing the top dielectric layer(s) with a transparent conducting oxide (TCO). This arrangement is shown, for example, in FIG. 21, which is a cross sectional view of an EMI filter for a plasma display panel (e.g., PDP panel) that does not necessarily require a conductive bus bar or conductive frame according to an example embodiment of this invention. In other words, FIG. 21 is a cross sectional view of an EMI filter for a PDP that allows for a direct connection through, e.g., a conductive tape between the layer stack comprising the EMI filter and the metal frame of the plasma television. In certain example embodiments, several alternating layers of dielectrics and silver may be provided, with the TCO layer 2110 being provided over the top-most Ag layer. For example, three or four layers of silver may be provided. In the FIG. 21 example, first dielectric layer(s) 2102 is provided nearest the surface of the glass substrate 1, a first silver layer 9 is provided over the first dielectric layer(s) 2102, second dielectric layer(s) 2104 is provided over the first silver layer 9, a second silver layer 19 is provided over the second dielectric layer(s) 2104, third dielectric layer(s) 2106 is provided over the second silver layer 19, a third silver layer 29 is provided over the third dielectric layer(s) 2106, fourth dielectric layer(s) 2108 is provided over the third silver layer 29, a fourth silver layer 39 is provided over the fourth dielectric layer(s) 2108, and a TCO layer 2110 is provided over the fourth silver layer 39.

Certain example embodiments use zinc oxide doped with aluminum (ZnO:Al) as the TCO, applied to a thickness of about 30-40 nm and a resistivity of about 1-2 mohmcm. At this thickness, the absorption of the conductive ZnO:Al TCO is less than about 1%. Furthermore, because the refractive index of ZnO:Al is very close to that of the $SnO_2$ and SiNx dielectric, the optical transmittance and reflectance are virtually identical.

The ZnO:Al layer, as an overcoat, has sufficiently low resistivity to create a low resistance contact between the top Ag layer in the TCC and the metal frame of the television. Electrical contact between the metal television frame and top Ag layer of the TCC coating is sufficient for EMI blocking. Furthermore, the impedance between the top Ag layer and the other Ag layers is very small, which is a result of the very thin dielectric between the silver layers and the large area of the filter.

Although certain example embodiments have been described in connection with a TCO overcoat layer over the top Ag layer comprising ZnO:Al, other TCO materials may be used in place of or in addition to ZnO:Al. Thus, TCO materials that may be used in connection with certain example embodiments include, for example, SnO:Sb, ITO, and TiOx:Nb. In general, materials having a refractive index of about 1.8 to 2.2 are preferable, although a refractive index of about 1.95-2.05 is more preferable, and a refractive index of 2.0 is still more preferable.

"Medium conductivity" is sufficient to ensure electrical contact to the metal frame of the television. Medium conductivity may be thought of as resistivity of between 1 mohmcm and 1 kohmcm. Electrical contact between the metal TV frame and the top Ag layer of the TCC coating is sufficient for EMI blocking. The frequency-dependent impedance $(1/(\omega C),$ where o) is the radial frequency) between the top Ag layer and the other Ag layers is very small because of the very thin dielectric between the silver layers and, the large area of the filter and the high frequency (30-1000 MHz). Therefore, the top Ag layer can be considered shorted to the other three or four silver layers in the stack at the frequencies of interest.

For example, using the example embodiment shown and described in FIG. 22 below, the capacitance between the top Ag layer and the Ag layer below is about 475 microFarad for a 42 inch diagonal filter. The value is about the same between the other Ag layers. At 30 MHz (e.g., the low frequency end of the EMI test) this translates into an impedance of about 1.1E-5 ohm between the Ag layers.

FIG. 22 is a cross sectional view of an EMI filter 2200 for a plasma display panel (e.g., PDP panel) that does not necessarily require a conductive bus bar or conductive frame according to an example embodiment of this invention. The FIG. 22 example embodiment shows a more detailed view of the FIG. 21 example layer stack, along with optional additional layers (including, for example, optional NiCrOx contact layers 11, 21, 31, and 41). For example, a single SiNx Base layer 2102 is provided as the dielectric closest to the surface of the glass substrate 1, whereas each of the other dielectrics include at least SnO2 and SiNx layers. Accordingly, it will be appreciated that the FIG. 22 example embodiment is similar in structure to the FIG. 20 example layer stack, except that the top-most dielectric layers from FIG. 20 (the SnO2 and SiNx layers) are replaced with a single TCO layer 2110 of or including one or more of the TCO's identified above—namely, ZnO:Al, SnO:Sb, ITO, and TiOx:Nb. However, the by replacing the top-most dielectric layers from FIG. 20 (the SnO2 and SiNx layers) with a single TCO layer 2110 (e.g., of or including one of the identified and/or other TCO materials), typical EMI blocking requirements are passed throughout the entire frequency range from about 30 to 1000 MHz, e.g., by providing a low sheet resistance, even when no conductive frame is provided and/or with the EMI filter 2200 directly contacts the metal frame of the plasma television (via, e.g., conductive tape). It will be appreciated that the inclusion of one or more titanium oxide (e.g., TiO2 or other suitable stoichiometry) layer(s) is preferred, as titanium oxide layers in general help increase visible transmission.

As noted above, the properties of the EMI filters of certain example embodiments that are capable of contacting the metal frames of plasma televisions, e.g., without conductive bus bars, frames, or the like, are similar to those shown and described in connection with FIG. 20. Thus, visible transmission may be at least about 60%, more preferably at least about 62% or 63%. However, sheet resistance may be kept the same, e.g., so as to enable suitable EMI blocking requirements to be met throughout the entire frequency range of interest (e.g., from about 30 to 1000 MHz). In this regard, sheet resistance preferable is below about 1 ohm/sq., more preferably below about 0.9 ohm/sq., and still more preferably below about 0.8 ohm/sq.

Using an Illuminate "C" test at a 2 degree observer angle, following heat treating for 10 minutes at a temperature of 600 degrees C., the transmission or Y value of an example was measured at 67.70%, glass side reflection was measured at 5.16%, and front side reflection was measured at 2.95%. As is desirable, the sheet resistance was low (below 1 ohm/sq.). As designed, the layer stack was expected to have a sheet resistance of about 0.90 ohm/sq. Surprisingly and unexpectedly, however, post-heat treating, the EMI filter in the example had a sheet resistance of about 0.77 ohm/sq.

The example embodiments described herein may lead to a number of illustrative advantages. For example, filter manufacturing may be simplified, as the screen printing of the conductive frit no longer is necessary. As described above in connection with the conductive black frit embodiments, certain example embodiments that implement a frameless TCC EMI filter also may result in a higher yield and lower manufacturing costs. Indeed, the frameless TCC EMI filter of certain example embodiments may be coated on large glass sheets and then cut to size, thus saving time while reducing the number of process steps and waste involved in the process.

Certain example embodiments advantageously also may result in improved durability, e.g., depending on the choice of the TCO overcoat. For example, better environmental durability may allow the film lamination steps to be reduced (e.g., only the AR film lamination may be required). Thus, a color correction film on the coating side may be eliminated in certain example embodiments, and color correction features instead can be added to the pressure-sensitive adhesive (PSA) on the front AR lamination film. Durability tests include, for example, mechanical durability tests (e.g., passing brush-scratch tests with scores of 0 at 150 strokes and scores of less than 1 at 300 strokes; passing tape pull tests with no delamination of the coating with the removal of a temporary protective film (TPF) or other tapes; etc), environmental durability tests (e.g., passing thermal cycling tests of two days exposure in 24-hour cycles of temperatures ranging from about 20-100 degrees F. while moving through the dew point, surviving two days exposure with condensed relative humidity of about 100% at temperatures of above 120 degrees F., sale-fog environmental durability tests, etc.), and/or the like.

While the materials shown for the various layers in the drawings are preferred materials in certain example embodiments of this invention, they are not intended to be limited unless expressly claimed. Other materials may be used to replace materials shown in the drawings in alternative example embodiments of this invention. Moreover, certain layers may be removed, and other layers added, in alternative embodiments of this invention. Likewise, the illustrated thicknesses also are not intended to be limiting unless expressly claimed.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A plasma display device comprising:
    a plasma display panel (PDP); and
    an electromagnetic interference (EMI) filter provided at a front portion of the plasma display panel, the EMI filter including an EMI coating supported by a glass substrate, the EMI coating including the following layers moving away from the glass substrate:
    a first high index layer having a refractive index (n) of at least about 2.2 located on and directly contacting the glass substrate;
    a first layer comprising silicon nitride;
    a first layer comprising zinc oxide;
    a first EMI shielding layer comprising silver contacting the first layer comprising zinc oxide;
    a first layer comprising an oxide of Ni and/or Cr contacting the first EMI shielding layer comprising silver;
    a first layer comprising metal oxide;
    a second layer comprising silicon nitride;
    a second layer comprising zinc oxide;
    a second EMI shielding layer comprising silver contacting the second layer comprising zinc oxide;
    a second layer comprising an oxide of Ni and/or Cr contacting the second EMI shielding layer comprising silver;
    a second layer comprising metal oxide;
    a third layer comprising silicon nitride;
    a second high index layer having a refractive index (n) of at least about 2.2;
    a third layer comprising zinc oxide;
    a third EMI shielding layer comprising silver contacting the third layer comprising zinc oxide;
    a third layer comprising an oxide of Ni and/or Cr contacting the third EMI shielding layer comprising silver; and
    an overcoat layer comprising a transparent conducting oxide (TCO),
    wherein the EMI filter has a sheet resistance of less than about 1 ohm,
    wherein the third EMI shielding layer comprising silver is thicker than each of the first and second EMI shielding layers comprising silver.

2. The plasma display device of claim 1, further comprising the following layers located, in order moving away from the glass, between the third layer comprising an oxide of Ni and/or Cr and the overcoat layer comprising a TCO:
    a third layer comprising metal oxide;
    a fourth layer comprising silicon nitride;
    a fourth layer comprising zinc oxide;
    a fourth EMI shielding layer comprising silver contacting the fourth layer comprising zinc oxide, the fourth EMI shielding layer comprising silver being thicker than each of the first, second and third EMI shielding layers comprising silver; and
    a fourth layer comprising an oxide of Ni and/or Cr contacting the fourth EMI shielding layer comprising silver.

3. The plasma display device of claim 2, wherein the first high index layer comprises an oxide of titanium.

4. The plasma display device of claim 2, the first and second high index layers comprising an oxide of titanium.

5. The plasma display device of claim 2, further comprising:
    a fourth layer comprising metal oxide located between the second layer comprising silicon nitride and the second layer comprising zinc oxide; and
    a fifth layer comprising metal oxide located between the fourth layer comprising silicon nitride and the fourth layer comprising zinc oxide.

6. The plasma display device of claim 5, wherein each said layer comprising metal oxide comprises an oxide of tin.

7. The plasma display device of claim 1, wherein the glass substrate and the EMI coating combined have a visible transmission of at least 55%.

8. The plasma display device of claim 7, wherein the EMI filter has a sheet resistance of less than about 0.9 ohm.

9. The plasma display device of claim 1, wherein the EMI filter directly contacts the PDP.

10. The plasma display device of claim 1, wherein the TCO comprises aluminum-doped zinc oxide.

11. The plasma display device of claim 1, wherein the TCO comprises at least one of: antimony-doped tin oxide, indium tin oxide (ITO), and niobium-doped titanium oxide.

12. The plasma display device of claim 1, wherein the overcoat layer comprising the TCO is about 30-40 nm thick, and wherein the TCO has a refractive index of about 1.95-2.05.

13. A plasma display device comprising:
a plasma display panel (PDP); and
an electromagnetic interference (EMI) filter including an EMI coating supported by a glass substrate, the EMI coating including the following layers moving away from the glass substrate:
an anti-reflective coating;
a first dielectric layer;
a first EMI shielding layer comprising silver;
a second dielectric layer;
a second EMI shielding layer comprising silver
a third dielectric layer;
a third EMI shielding layer comprising silver
a fourth dielectric layer;
a fourth EMI shielding layer comprising silver; and
an overcoat layer comprising a transparent conducting oxide (TCO),
wherein the glass substrate and the EMI coating combined have a visible transmission of at least about 60%,
wherein the EMI filter has a sheet resistance of less than about 0.9,
wherein the TCO has a refractive index of about 1.95-2.05
wherein the overcoat layer comprising the TCO is in electrical contact with an overlapping metal frame of the plasma display panel.

14. The plasma display device of claim 13, wherein the second, third, and fourth dielectric layers each comprise a layer comprising silicon nitride supported by a layer comprising tin oxide, and wherein the first dielectric layer comprises a layer comprising silicon nitride.

15. The plasma display device of claim 14, wherein the TCO comprises at least one of aluminum-doped zinc oxide, antimony-doped tin oxide, indium tin oxide (ITO), and niobium-doped titanium oxide.

16. An EMI filter for a plasma display device comprising:
an EMI coating supported by a glass substrate, the EMI coating including the following layers moving away from the glass substrate:
a first high refractive index layer;
a first layer comprising silicon nitride;
a first layer comprising zinc oxide;
a first EMI shielding layer comprising silver contacting the first layer comprising zinc oxide;
a first layer comprising an oxide of Ni and/or Cr contacting the first EMI shielding layer comprising silver;
a first layer comprising metal oxide;
a second layer comprising silicon nitride;
a second layer comprising zinc oxide;
a second EMI shielding layer comprising silver contacting the second layer comprising zinc oxide;
a second layer comprising an oxide of Ni and/or Cr contacting the second EMI shielding layer comprising silver;
a second layer comprising metal oxide;
a third layer comprising silicon nitride;
a third layer comprising zinc oxide;
a third EMI shielding layer comprising silver contacting the third layer comprising zinc oxide;
a third layer comprising an oxide of Ni and/or Cr contacting the third EMI shielding layer comprising silver;
a third layer comprising metal oxide;
a fourth layer comprising silicon nitride;
a fourth layer comprising zinc oxide;
a fourth EMI shielding layer comprising silver contacting the fourth layer comprising zinc oxide;
a fourth layer comprising an oxide of Ni and/or Cr contacting the fourth EMI shielding layer comprising silver; and
an overcoat layer comprising a transparent conducting oxide (TCO),
wherein the EMI filter has a sheet resistance of less than about 1,
wherein the overcoat layer comprising the TCO is about 30-40 nm thick, and
wherein the TCO has a refractive index of about 1.95-2.05
wherein the overcoat layer comprising the TCO is adapted to be in electrical contact with an overlapping metal frame of the plasma display device, and wherein the fourth EMI shielding layer comprising silver is thicker than at least two of the first, second and third EMI shielding layers comprising silver.

17. The EMI filter of claim 16, further comprising a second high refractive index layer, the second high refractive index layer being located between the second and third EMI shielding layers, wherein the first and second high refractive index layers comprises an oxide of titanium.

18. The EMI filter of claim 17, further comprising:
a fourth layer comprising metal oxide located between the second layer comprising silicon nitride and the second layer comprising zinc oxide; and
a fifth layer comprising metal oxide located between the fourth layer comprising silicon nitride and the fourth layer comprising zinc oxide,
wherein each said layer comprising metal oxide comprises an oxide of tin.

19. The EMI filter of claim 16, wherein the glass substrate and the EMI coating combined have a visible transmission of at least 60%.

20. The EMI filter of claim 16, wherein the EMI filter has a sheet resistance of less than about 0.9.

21. The EMI filter of claim 16, wherein the TCO comprises at least one of: aluminum-doped zinc oxide, antimony-doped tin oxide, indium tin oxide (ITO), and niobium-doped titanium oxide.

* * * * *